(12) United States Patent
Nguyen

(10) Patent No.: US 12,009,179 B2
(45) Date of Patent: Jun. 11, 2024

(54) BIAS SUPPLY CONTROL AND DATA PROCESSING

(71) Applicant: Advanced Energy Industries, Inc., Fort Collins, CO (US)

(72) Inventor: Hien Minh Nguyen, Longmont, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

(21) Appl. No.: 18/141,448

(22) Filed: Apr. 30, 2023

(65) Prior Publication Data

US 2023/0343556 A1    Oct. 26, 2023

Related U.S. Application Data

(63) Continuation of application No. 17/584,921, filed on Jan. 26, 2022, now Pat. No. 11,670,487.

(51) Int. Cl.
*H02M 3/155* (2006.01)
*H01J 37/32* (2006.01)

(52) U.S. Cl.
CPC ....... *H01J 37/32174* (2013.01); *H02M 3/155* (2013.01)

(58) Field of Classification Search
None
See application file for complete search history.

(56) References Cited

U.S. PATENT DOCUMENTS 10,707,055 B2 * 7/2020 Shaw ................ H01J 37/32568
11,437,221 B2 * 9/2022 Carter ............... H01J 37/32082
2021/0351007 A1   11/2021 Carter

OTHER PUBLICATIONS

M. Hochstrasser, International Search Report, dated Jun. 4, 2023, European Patent Office.

* cited by examiner

*Primary Examiner* — Jeffrey S Zweizig
(74) *Attorney, Agent, or Firm* — Neugeboren O'Dowd PC

(57) ABSTRACT

Bias supplies and plasma processing systems are disclosed. One bias supply comprises an output node, a return node, and a switch network and at least one power supply coupled to the output node and the return node. The switch network and the at least one power supply configured, in combination, to apply an asymmetric periodic voltage waveform and provide a corresponding current waveform at the output node relative to the return node.

18 Claims, 22 Drawing Sheets

BIAS SUPPLY CONTROL AND DATA PROCESSING

CLAIM OF PRIORITY UNDER 35 U.S.C. § 120

The present application for patent is a Continuation of patent application Ser. No. 17/584,921 entitled "BIAS SUPPLY CONTROL AND DATA PROCESSING" filed Jan. 26, 2022, pending, and assigned to the assignee hereof and hereby expressly incorporated by reference herein.

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or radio frequency (RF)) may be applied to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the AC cycle. And when the ions impact the surface of the substrate, the impact dislodges material from the surface of the substrate-effectuating the etching.

In many instances, it is desirable to have a narrow (or specifically tailorable) ion energy distribution but applying a sinusoidal waveform to the substrate induces a broad distribution of ion energies, which limits the ability of the plasma process to carry out a desired etch profile. Known techniques to achieve a narrow (or specifically tailorable) ion energy distribution are expensive, inefficient, difficult to control, and/or may adversely affect the plasma density. As a consequence, many of these known techniques have not been commercially adopted. Accordingly, a system and method are needed to address the shortfalls of present technology and to provide other new and innovative features.

SUMMARY

An aspect may be characterized as a bias supply to apply a periodic voltage. The bias supply comprising a switch network and at least one power supply that are configured, in combination, to apply an asymmetric periodic voltage waveform and provide a corresponding current waveform.

Yet another aspect may be characterized as a method for applying a periodic voltage comprising applying an asymmetric periodic voltage waveform and providing a corresponding current waveform.

Another aspect disclosed herein may be characterized as a bias supply to apply a periodic voltage. The bias supply comprises means for applying an asymmetric periodic voltage waveform and providing a corresponding current waveform. A metrology component is configured to receive and sample voltage and current signals indicative of a full cycle of the periodic voltage waveform and the corresponding current waveform to provide digital representations of a full cycle of the asymmetric periodic voltage waveform and a full cycle of the corresponding current waveform.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators are those whose energy is primarily directed to generating and sustaining the plasma, while "bias supplies" are those whose energy is primarily directed to generating a surface potential for attracting ions and electrons from the plasma.

Figure 1:
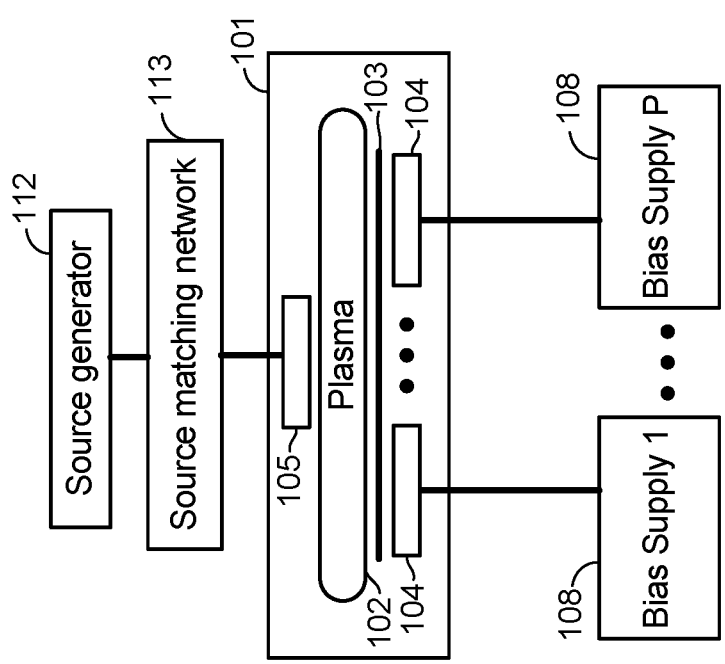
FIG. 1 is a block diagram depicting an exemplary plasma processing environment in which bias supplies disclosed herein may be utilized.

Described herein are control aspects of bias supplies that may be used to apply a periodic voltage function to a substrate support in a plasma processing chamber. Referring first to FIG. 1, shown is an exemplary plasma processing environment (e.g., deposition or etch system) in which bias supplies may be utilized. The plasma processing environment may include many pieces of equipment coupled directly and indirectly to a plasma processing chamber 101, within which a volume containing a plasma 102 and workpiece 103 (e.g., a wafer) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020 and U.S. Pat. No. 10,811,227, issued Oct. 20, 2020, both of which are incorporated by reference in their entirety, disclose various types of system designs.

It should also be recognized that, while the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Figure 2:
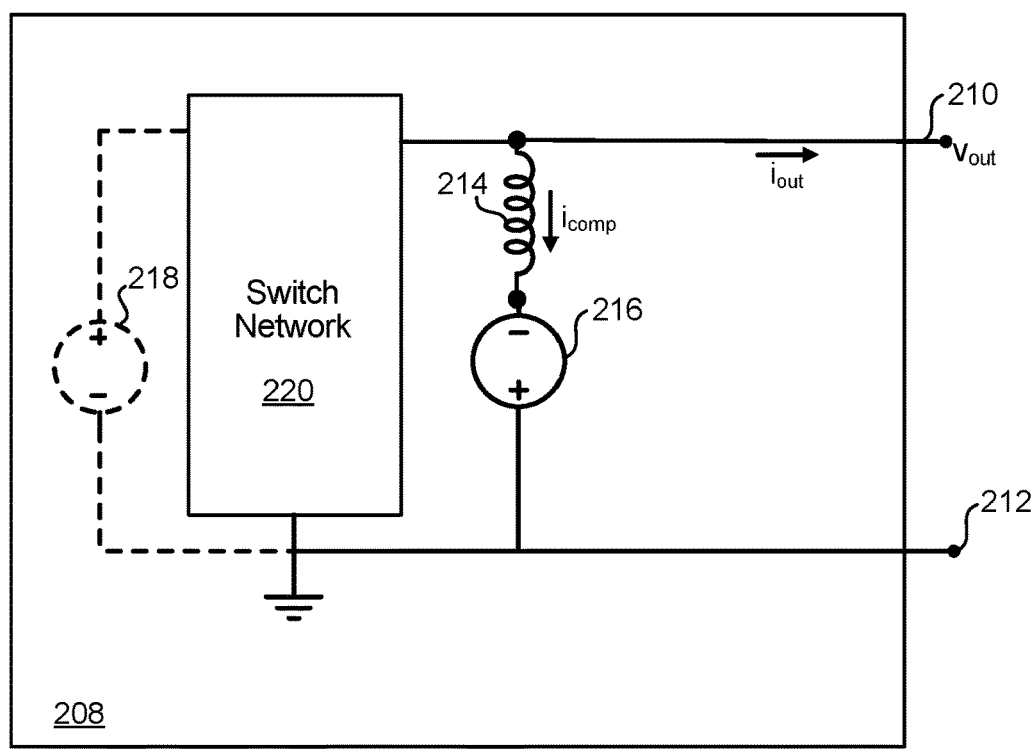
FIG. 2 is a schematic diagram depicting an exemplary bias supply.

Referring to FIG. 2, shown is an exemplary bias supply 208 that may be utilized to implement the bias supplies 108 described with reference to FIG. 1. The bias supply 208 generally represents many variations of bias supplies described further herein to apply a periodic voltage function. Thus, reference to the bias supply 208 generally refers to any of the bias supplies described further herein. As shown, the bias supply 208 includes an output 210 (also referred to as an output node 210), a return node 212, a switch network 220, and a series combination of an inductance 214 and a first power supply 216 (also referred to herein as Vsupply) that is coupled between the output node 210 and the return node 212. Also shown is an optional second power supply 218 (also referred to herein as Vrail). In general, the bias supply 208 functions to apply an asymmetric periodic voltage function between the output node 210 and the return node 212. Current delivered to a load through the output node 210 is returned to the bias supply 208 through the return node 212 that may be common with the load.

Although not depicted in FIG. 2 for clarity and simplicity, the bias supply 208 may be coupled to a controller and/or include a controller that is coupled to the switch network 220. Variations of the switch network 220 (and variations with and without the second power supply 218) are disclosed further herein, but first, it is helpful to understand aspects of a plasma load.

Figure 3:
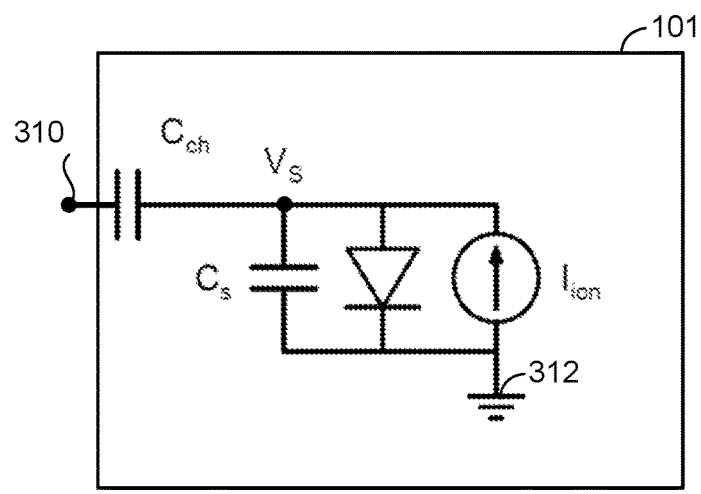
FIG. 3 is a schematic diagram electrically representing aspects of a plasma processing chamber.

Referring briefly to FIG. 3, shown is a schematic drawing that electrically depicts aspects of an exemplary plasma load within the plasma processing chamber 101. As shown, the plasma processing chamber 101 may be represented by a chuck capacitance $C_{ch}$ (that includes a capacitance of a chuck and workpiece 103) that is positioned between an input 310 (also referred to as an input node 310) to the plasma processing chamber 101 and a node representing a sheath voltage, Vs, at a surface of the workpiece 103 (also referred to as a wafer substrate 103). As a consequence, references to the sheath voltage, Vs, are also referred to herein as a voltage at a surface of the wafer or substrate. In addition, a return node 312 (which may be a connection to ground) is depicted. The plasma 102 in the processing chamber is represented by a parallel combination of a sheath capacitance Cs, a diode, and a current source. The diode represents the non-linear, diode-like nature of the plasma sheath that results in rectification of the applied AC field, such that a direct-current (DC) voltage drop, appears between the workpiece 103 and the plasma 102.

Figure 4:
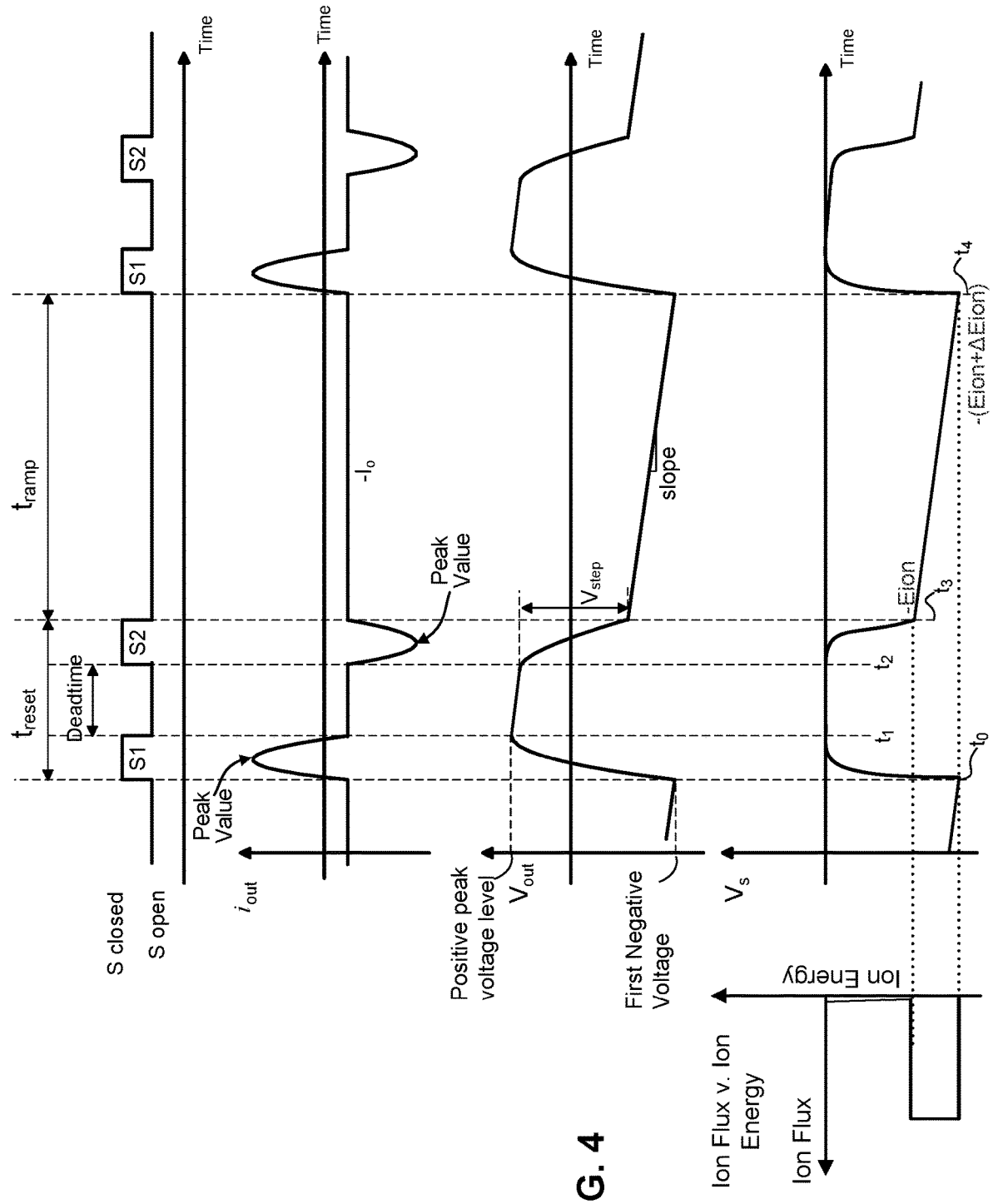
FIG. 4 depicts graphs and a timing diagram depicting aspects of a bias supply that comprises two switches.
Figure 5:
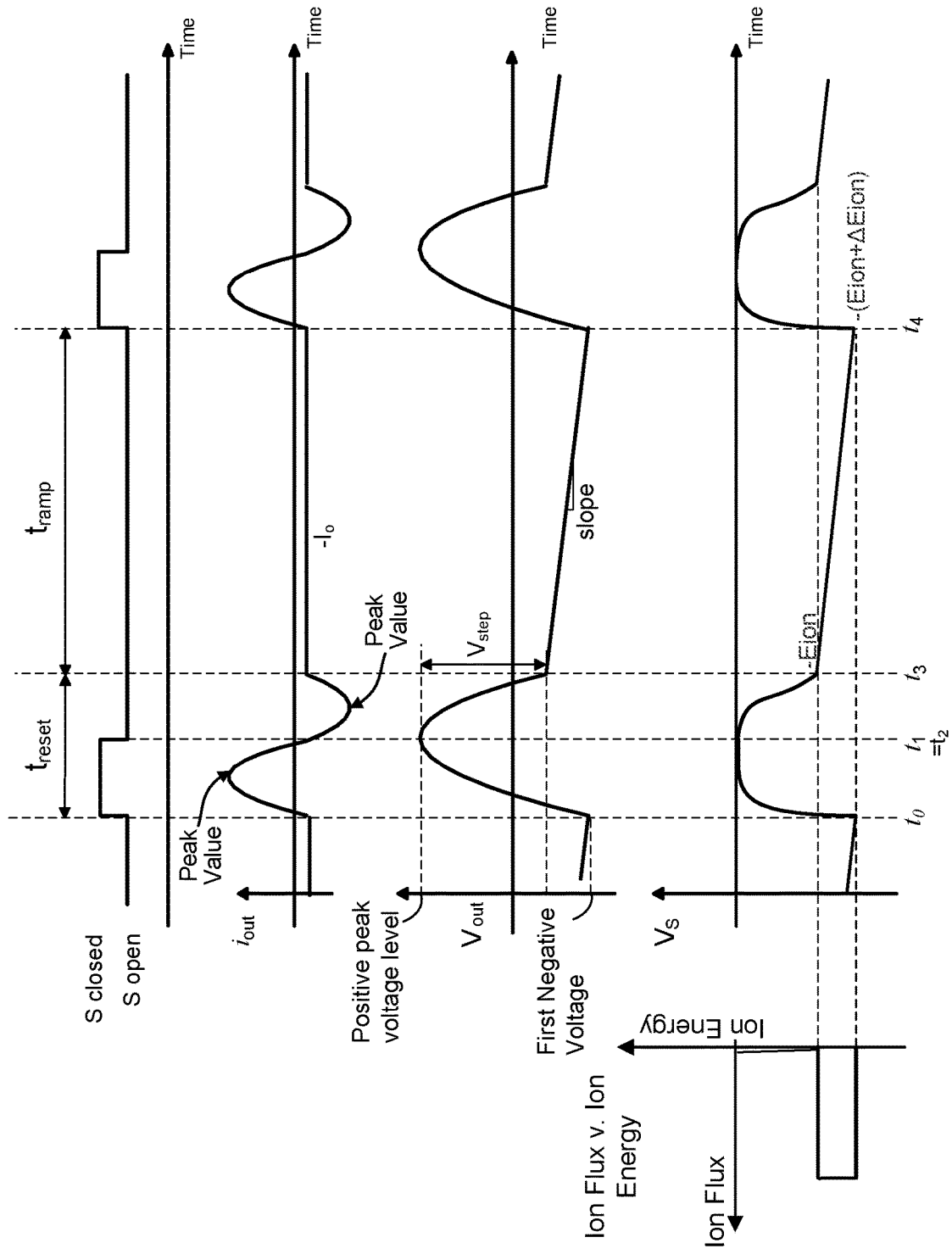
FIG. 5 depicts graphs and a timing diagram depicting aspects of a bias supply that comprises a single switch.

Referring next to FIGS. 4 and 5, shown are timing diagrams associated with implementations of the bias supplies 208 that have two switches and one switch, respectively. In each of FIGS. 4 and 5 shown are an asymmetric periodic voltage waveform and provide a corresponding current waveform. As depicted, the bias supplies 208 disclosed herein operate to apply an asymmetric periodic voltage waveform, Vo, (from time t0 to t4) between the output node 210 and the return node 212. As shown, the asymmetric periodic voltage waveform, Vo, comprises a first portion (from time t0 to t2) that begins with a first negative voltage and changes to a positive peak voltage (at time t1) during the first portion, the asymmetric periodic voltage also changes from the first portion to a third voltage level (at time t3) during a second portion (from time t2 to t3), and the asymmetric periodic voltage waveform comprises a third portion (from time t3 to t4) that includes a voltage ramp between the third voltage level and a fourth, negative voltage level (at time t4).

As shown in FIGS. 4 and 5, the asymmetric periodic voltage waveform comprises a voltage step, Vstep, between times t2 and t3, and Vstep corresponds to a sheath voltage at t3 that produces ions at any energy level, -Eion. And during the third portion of the asymmetric periodic voltage waveform, the sheath voltage may become more negative so that at t4, ions at an energy level of Eion+ΔEion are produced. Also shown in FIGS. 4 and 5 are times $t_{reset}$ (between times t0 and t3) and tramp (between times t3 and t4). As shown, $t_{reset}$ covers a time that includes both the first and second portions of the asymmetric periodic voltage waveform, and tramp includes the third portion. Also shown in FIGS. 4 and 5 are examples of the compensation current referenced in FIG. 2. Compensation current, Icomp, may be provided throughout the application of the asymmetric periodic voltage function, and Iout may or may not equal Icomp during the third portion of the asymmetric periodic voltage waveform (during tramp).

As discussed further herein, a fundamental period (from t0 to t4) of the asymmetric periodic voltage waveform may be adjusted to adjust a spread of ion energies. As shown in FIGS. 4 and 5, a full current cycle occurs between times t0 and t3 during the first and second portions of the asymmetric periodic voltage waveform. And the time between full current cycles is the time, $t_{ramp}$, between t3 and t4. An aspect of the present disclosure addresses the problem of how to adjust the current, Iout, to compensate for the ion current $I_{ion}$. Another aspect of the present disclosure addresses the problem of how to adjust a level of ion energies and distribution of the ion energies in the plasma chamber.

As shown in FIG. 4, in variations of the bias supplies, 208 that comprise two switches, the first portion of the asymmetric periodic voltage waveform may transition (during the time between time $t_1$ to $t_2$) to the second portion of the asymmetric periodic voltage waveform. And as shown in FIG. 5, in variations of the bias supplies 208 that comprise one switch, t1 may equal t2 and the first portion of the asymmetric periodic voltage waveform may end (and the second portion may start) at a positive peak voltage level.

Further details of both single-switch and two-switch bias supplies are disclosed further herein, but FIGS. 4 and 5 provide a reference for the variations control methodologies and the various structural variations disclosed further herein.

Shown in FIG. 4 are a switching sequence of a first switch, S1, and a second switch, S2; current, $I_{out}$, provided at the output node 210 of the bias supply 208; voltage, Vout, at the output node 210 of the bias supply 208; and the sheath voltage, Vs (also shown in FIG. 3); and a corresponding ion energy distribution function (IEDF) depicted as ion flux versus ion energy.

As shown in FIG. 4. the first switch, S1, and the second switch, S2, may be controlled so that output current, $I_{out}$, completes a full current cycle between times to and $t_3$. During a start of a current cycle at to, the output current, $I_{out}$, is controlled from a level $-I_o$, to reach a positive peak current value, and then the current is controlled to fall back to $-I_o$, at $t_1$. Then, at $t_2$, the output current, $I_{out}$, is controlled from $-I_o$, to increase, to a peak value in an opposite direction (opposite from the positive peak current value) before decreasing back to $-I_o$ at $t_3$. More specifically, during the positive portion of the current cycle (when the first switch, S1, is closed and the second switch, S2, is open), the current increases to a peak positive value then decreases to $-I_o$. During a negative portion (from time $t_2$ to $t_3$) of the full current cycle, the current increases to a negative value peak value then decreases to $-I_o$.

As shown, in FIG. 4, the first switch, S1, and the second switch, S2, may be controlled with an adjustable deadtime, which is the time from $t_1$ to $t_2$ (after the switch, S1, is opened from a closed position and before S2 is closed).

As depicted in FIG. 4, control the deadtime enables control over $t_{reset}$, and adjusting a ratio of $t_{reset}$ to $t_{ramp}$ adjusts average power. And control over $t_{reset}$ enables the fundamental switching frequency to be controlled (e.g., to remain below a level that affects plasma density in the plasma processing chamber 101).

Another aspect of control that may be achieved with the bias supply 208 disclosed herein is ion current compensation. More specifically, the length of the deadtime, the length of $t_{ramp}$, and/or the period of the periodic voltage function (between $t_0$ and $t_4$) may be controlled to control a level of ion current compensation. In FIG. 4, $t_{ramp}$, the deadtime, and/or the level, $I_o$, may be controlled (if desired) so that ion current, $I_{ion}$, is compensated to a point where $I_o=I_{ion}-(Cch+Cstr1)*slope$ and $I_{comp}=I_{ion}-(Cch+Cstr0+Cstr1)*slope$ where slope is the slope of the output voltage, Vout, from t3 to t4.

As shown in FIG. 4, when overcompensating for ion current, the sheath voltage Vs (and the voltage at the surface of the workpiece 103) becomes increasingly negative between times t3 and t4 (during the $t_{ramp}$ time frame). And due to the range of sheath voltages between t3 and t4, there is a distribution of ion energies. It should be recognized, however, that ion current may be undercompensated so that the sheath voltage Vs (and the voltage at the surface of the workpiece 103) becomes less negative between times t3 and t4 (during the $t_{ramp}$ time frame).

It is also possible to adjust the slope of the bias output voltage, Vout, between t3 and t4 so that the sheath voltage, Vs, is substantially constant between t3 and t4, which results in a very narrow distribution of ion energy.

By adjusting both deadtime and $t_{ramp}$, the frequency of the periodic voltage waveform may be fixed if desired, but it is also possible to vary the deadtime, $t_{ramp}$, and the frequency of the periodic voltage waveform. It is also contemplated that the deadtime may be shortened while shortening or lengthening $t_{ramp}$.

Referring to FIG. 5, shown are waveforms depicting electrical aspects of the bias supply 208 and plasma processing chamber 101 when the switch network 220 is implemented with a single switch, as shown in FIG. 5, the switch network may be controlled so that output current, $I_{out}$, completes a full cycle from $-I_o$ to a peak value, back to $-I_o$, to a peak value in an opposite direction and back to $-I_o$. It should be recognized the peak value of the current in a first half of the current cycle may be different than the peak value of the current in the second half of the current cycle.

Figure 6:
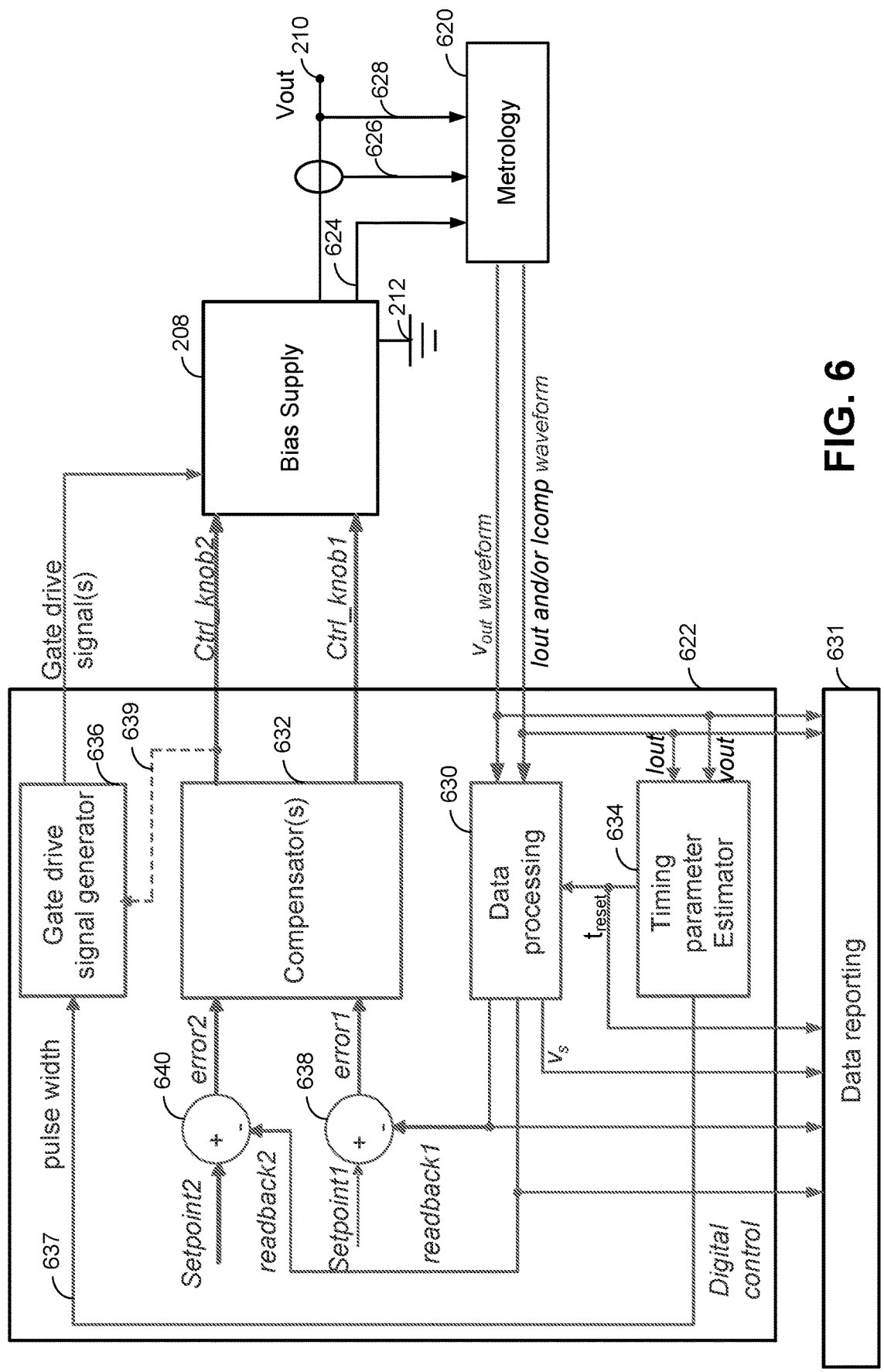
FIG. 6 is a block diagram depicting aspects of sampling, readback, and control of a bias supply.

Referring next to FIG. 6, shown is a block diagram depicting general aspects of metrology, readback and control. Shown are the bias supply 208, a metrology component 620 and a digital control section 622. In general, the metrology component 620 receives and samples signals indicative of power-related parameter values and provides a digital representation of the power-related parameter values to the digital control section 622. For example, the power-related parameters may be current provided to the output node 210 and voltage, Vout, between the output node 210 and the return node 212. Although not required, the return node may be a ground connection.

The metrology component 620 may receive and sample signals from one or more bias-supply-signal lines 624. The bias-supply signal lines 624 may convey signals indicative of bias-supply parameters such as Icomp, temperature, and other parameters within the bias supply 208. A current-signal line 626 may provide analog signals from a current transducer that are indicative of output current, $I_o$, provided to the output node 210, and a voltage line 628 may provide analog signals that are indicative of the voltage, Vout, at the output of the bias supply. In response to receiving the power-related signals (indicative of Io and Vout), the metrology component 620 samples and digitizes the power-related signals. For example, the metrology component 620 may provide complete digital representations of the asymmetrical periodic voltage waveform, Vout; the output current, $i_{out}$, and/or $i_{comp}$.

An aspect of many variations of the metrology component 620 is that the complete voltage and current waveforms are captured, which provides enhanced visibility of the output of the bias supply, and also enables improved control aspects disclosed further herein.

Although not required, the metrology component 620 may be realized in part by a field programmable gate array, and the digital control section may be realized by one or more processors that execute code stored in non-transitory media (to effectuate the functions of the digital control section 622). But other combinations of hardware, software, and firmware may be used to realize the metrology component 620 and the digital control section 622.

As shown, the digital representations of the asymmetrical periodic voltage waveform, Vout; the output current, $i_{out}$ and/or $i_{comp}$ may be provided to a data reporting component 631, which may be a user interface (e.g., a touchscreen display). In addition, the digital representations of the asymmetrical periodic voltage waveform, Vout; the output current, $i_{out}$ and/or $i_{comp}$ are provided to a data processing module, which may further process the digital representations of the asymmetrical periodic voltage waveform, Vout; the output current, $i_{out}$ and/or $i_{comp}$ to provide readback of one or more of sheath voltage, Vs, and one or more other parameter values such as Eion, Vstep, ΔEion, output voltage slope (e.g., the slope of the third portion of the asymmetrical periodic voltage waveform), and/or a slope deviation factor, Ks.

The slope deviation factor, Ks, may be calculated as:

$$K_s = \frac{C_{chuck}}{C_{chuck} + C_{stray1}} \times \frac{Slope_w}{Slope}$$

where slope, is the slope from t3 to t4 of wafer/sheath voltage.

Or in the alternative, the slope deviation factor may be calculated to satisfy the following equation:

$$(1 - K_s)\left(1 + \frac{C_{stray1}}{C_{chuck}}\right) \cdot Slope + \frac{I_o}{C_{chuck}} = 0$$

The slope deviation factor, Ks, provides a convenient representation of a level of compensation current, $I_{comp}$, relative to the ion current, $I_{ion}$. For example, when Ks is equal to zero, the compensation current is providing a full compensation; when Ks>0, $I_{comp}$ is overcompensating for the ion current, and when Ks<0, the compensation current, $I_{comp}$, is undercompensating for the ion current, $I_{comp}$.

As shown, the readback values (depicted for example as readback1 and readback 2) may also be used as part of feedback control. As shown, a first comparator 638 may calculate a difference between a first setpoint, setpoint1, and a first readback value, readback1, to produce a first error signal, error1. And a second comparator 640 may calculate a difference between a second setpoint, setpoint2, and a second readback value, readback2, to produce a second error signal: error2. As shown, the error signals (error1 and error 2) are fed to one or more compensators 632, and the one or more compensators 632 may provide control signals (Ctrl_knob1 and Ctrl_knob2) to the bias supply 208 as described further herein.

Also shown within the digital control section 622 is a timing parameter estimator 634, which may receive the digital representations of the output waveform, Vout, and the output current, $I_{out}$, and produce a pulse-width control signal. According to an aspect, the timing parameter estimator 634 detects when there is zero current through switches of the bias supply to reduce switching-related losses. The timing parameter estimator 634 may also determine $t_{reset}$ (shown in FIGS. 4 and 5), and the value for $t_{reset}$ may be reported via the data reporting component 631 and the value for $t_{reset}$ may be provided to the data processing module 630.

The digital control section 622 also comprises a gate drive signal generator 636 that is configured to provide gate drive signals to the switches (S1, S2) of the bias supply 208 responsive to the pulse-width control signal 637 from the timing parameter estimator 634 and/or responsive to a control signal 639 output by the one or more compensators 632. Although many types of switches are controlled by electrical gate drive signals, it is also contemplated that optical control signals may be used. For example, the gate drive signal generator 636 may provide optical signals.

Figure 7:
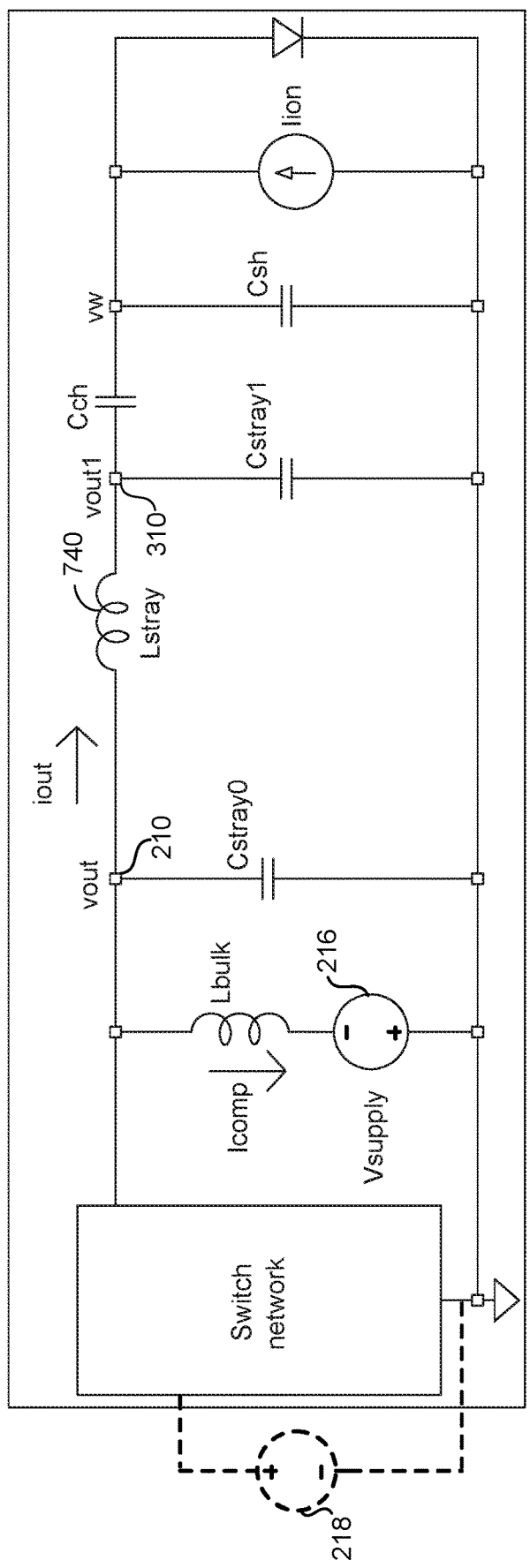
FIG. 7 is a schematic diagram depicting inductance that affects a voltage applied to a plasma chamber relative to a bias supply.

Another aspect of the capabilities of the data processing module 630 is the ability to compensate for inductance between the output 210 of the bias supply 208 and the input 310 to the plasma chamber. Referring to FIG. 7, shown is a lumped-element inductance 740 (also referred to as stray inductance 740) representing inductive elements between the output 210 of the bias supply 208 and the input 310 to the plasma chamber. In many implementations, the digital representations of the asymmetric periodic voltage waveform (output by the metrology component 620) may be adjusted, e.g., by the data processing module 630, (to obtain an adjusted digital representation of the asymmetric periodic voltage waveform) to compensate for the stray inductance 740. By compensating for the inductance 740, Vstep at the input 310 to the plasma chamber may be calculated; a wafer voltage value may be calculated; and an ion energy value Eion may be calculated.

Figure 8A:
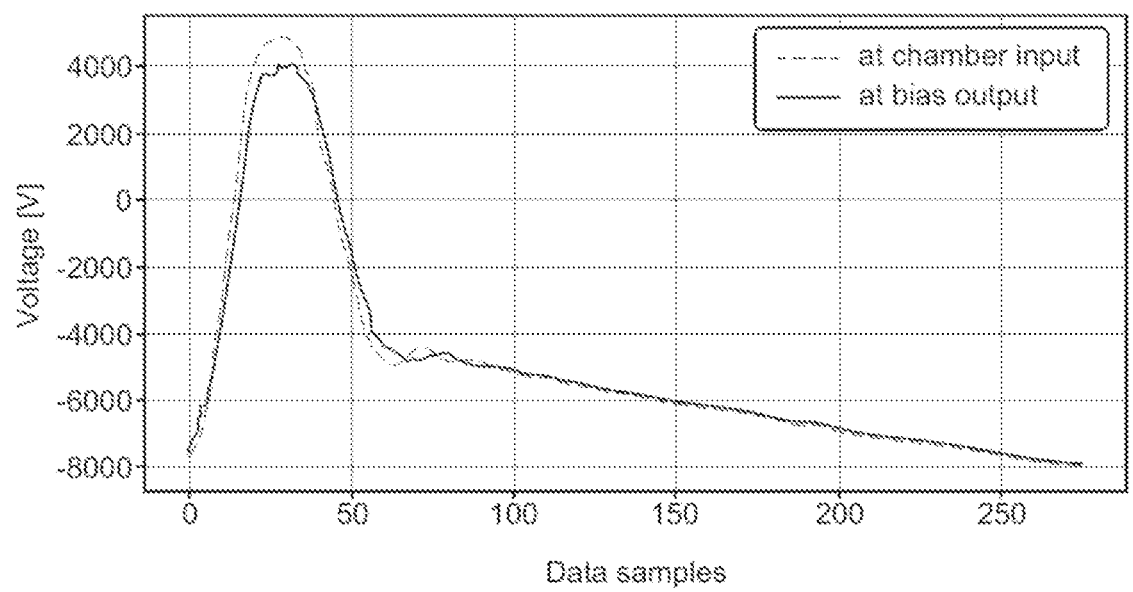
FIG. 8A is a graph depicting the effect of the inductance depicted in FIG. 7.

As shown in FIG. 8A, due to the inductance 740, the voltage, vout1, actually applied at the input 310 to the plasma processing chamber 101 differs from the voltage, Vout, applied at the output node 210 of the bias supply 208. As a consequence, the data processing module 630 may be configured to estimate the voltage, vout1, actually applied to the plasma processing chamber 101:

$$v_{out1} = v_{out} - L_{stray}\frac{di_{out}}{dt}$$

where Lstray is the inductance 740. It should be noted that that in the presence of noise and parasitic ringing, the vout and $i_{out}$ signals can be filtered in the metrology component 620 and/or digitally filtered in the data processing module 630 before all the calculations are performed.

Figure 8B:
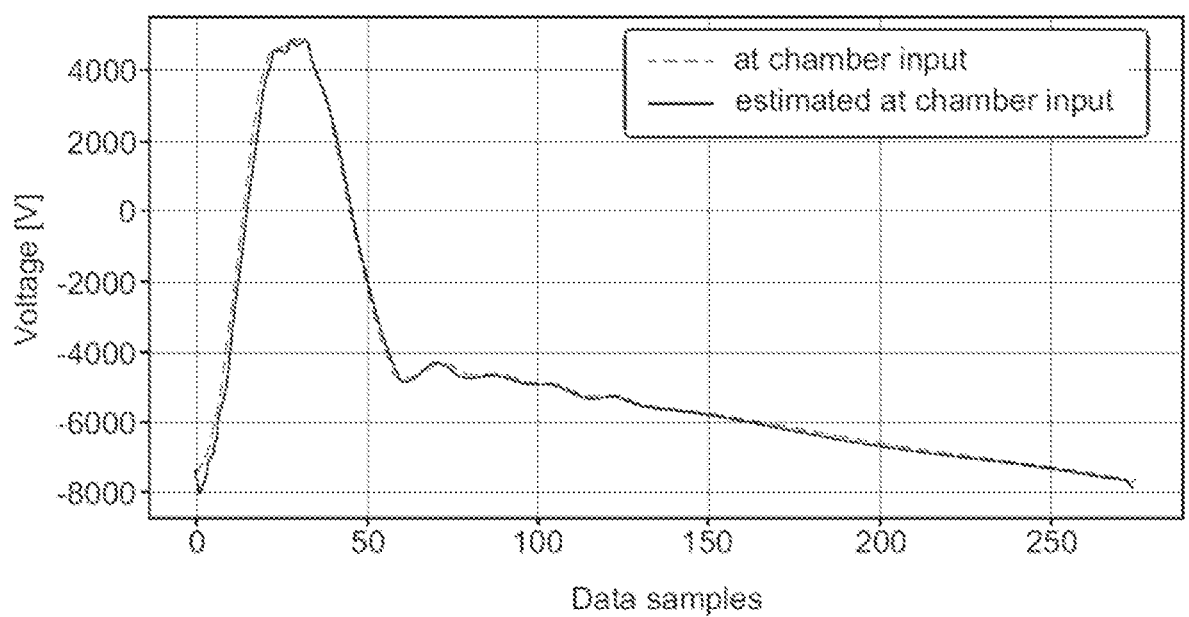
FIG. 8B is a graph depicting the results of a method to compensate for the inductance depicted in FIG. 7 to mitigate against the effect depicted in FIG. 7.

As shown in FIG. 8B, the estimated voltage, vout1, closely matches the actual voltage at the chamber input 310.

In addition, Eion may be more accurately calculated by taking the inductance into consideration:

$$E_{ion} \approx \frac{C_{ch}}{C_{ch}+C_{sh}}\left[V_{step} + L_{stray}\left(\frac{di_{out}}{dt}|_{t3reset} - \frac{di_{out}}{dt}|_{tvmax2}\right)\right]$$

Figure 9A:
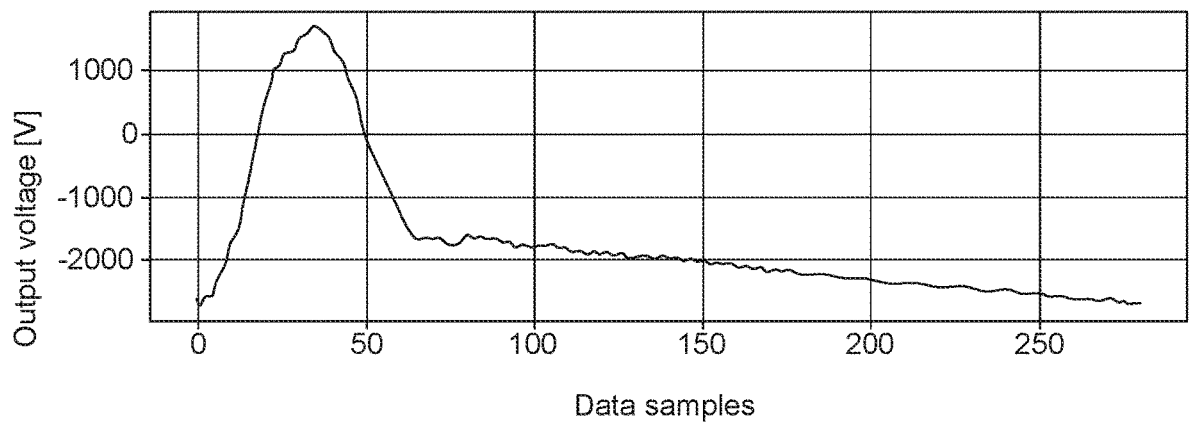
FIG. 9A depicts an example of an asymmetric periodic voltage waveform.
Figure 9B:
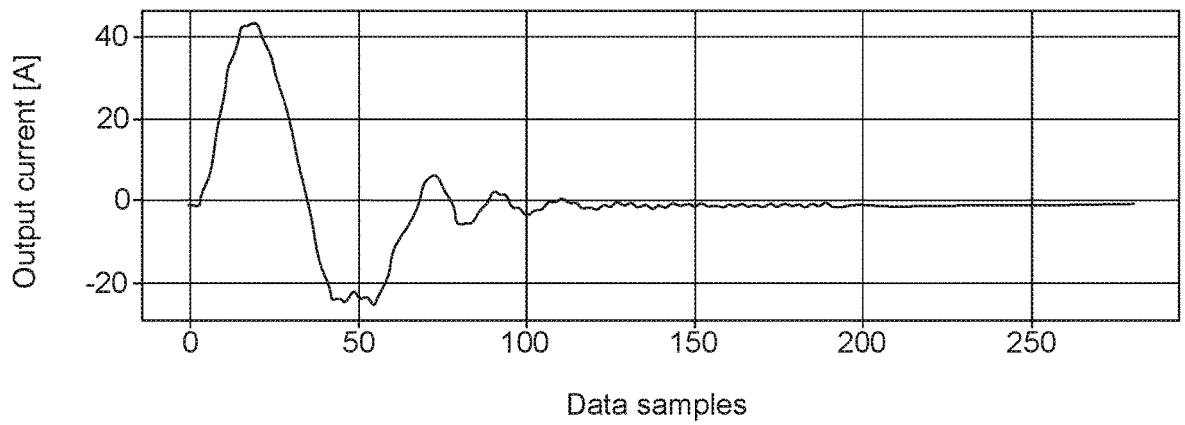
FIG. 9B depicts an example of output current associated with the asymmetric periodic voltage waveform depicted in FIG. 9B.
Figure 9C:
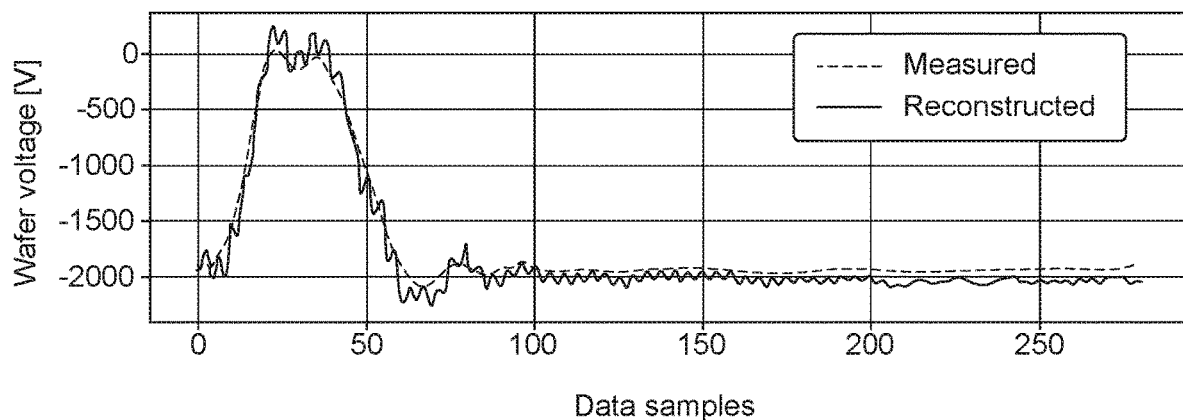
FIG. 9C depicts a wafer voltage reconstructed from the voltage waveform of FIG. 9A and the current waveform of FIG. 9B according to a method disclosed herein.

Wafer voltage may also be more accurately reconstructed by compensating for the inductance 740. Referring to FIGS. 9A and 9B, shown are examples of output voltage and output current associated with operation of a bias supply 208. And FIG. 9C shows measurements of an actual wafer voltage in comparison with a reconstructed wafer voltage that is reconstructed using the data from FIGS. 9A and 9B.

For example, the reconstructed wafer voltage, Vw, may be determined as:

$$v_w(t) = v_w(t_0) + \frac{C_{ch}+C_{stray1}}{C_{ch}}[v_{out1}(t) - v_{out1}(t_0)] - \frac{1}{C_{ch}}\int_{t_0}^{t}i_{out}dt$$

Where $C_{stray1}$ is a lumped-element capacitance representing capacitance from an output of the bias supply 208 to an input 310 of the chamber 101 (including a capacitance of a connector and filter capacitance).

And FIG. 9C shows how close the reconstructed wafer voltage is to the actual, measured wafer voltage. It should be noted that in some implementations, by virtue of capturing the entire current and voltage waveforms (as described with reference to FIG. 6), a complete reconstruction of the wafer waveform may be obtained.

Figure 10:
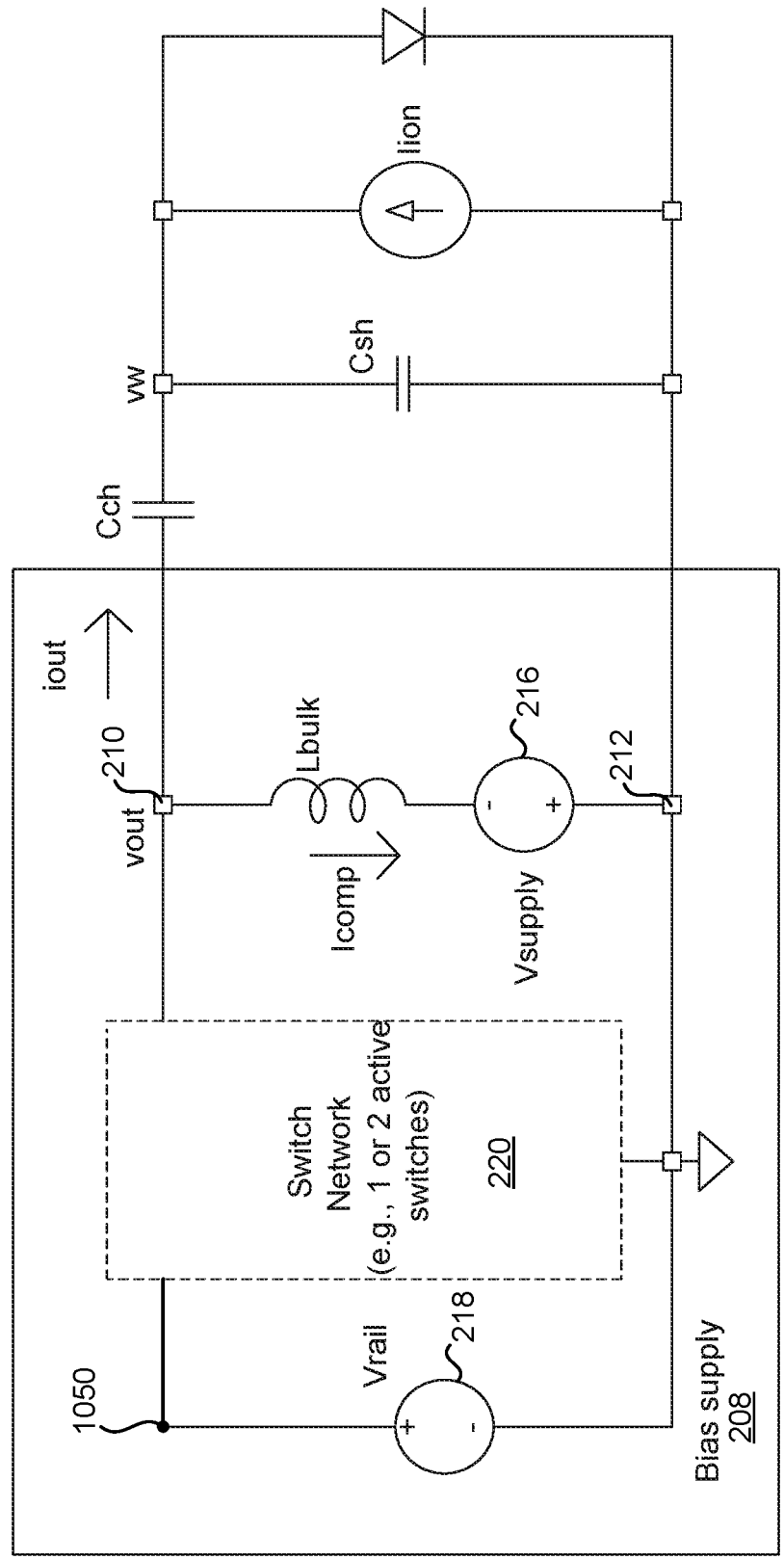
FIG. 10 is a schematic diagram depicting an example of a bias supply with two power supplies.
Figure 11:
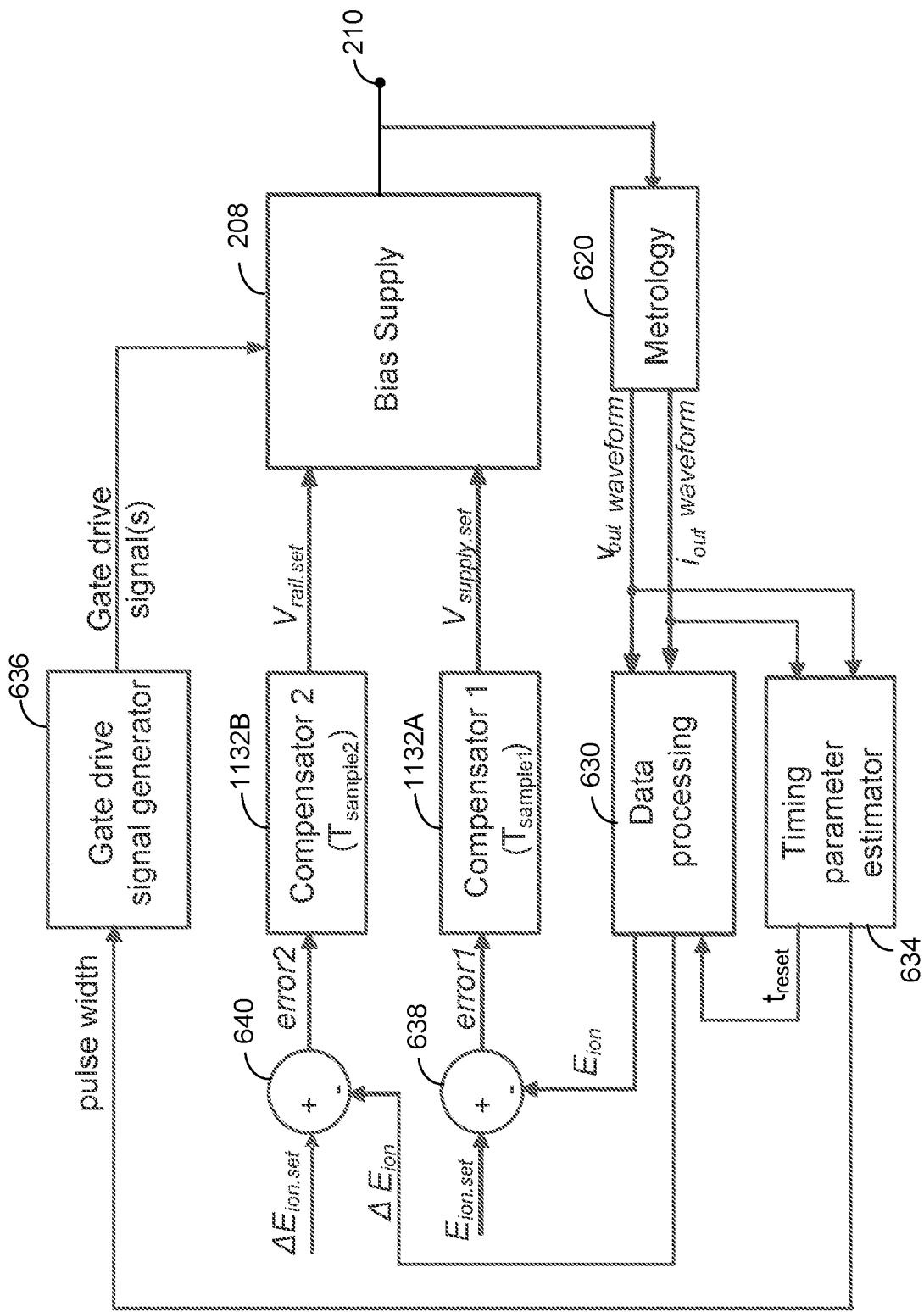
FIG. 11 is a block diagram depicting a control system for a bias supply with two power supplies such as the bias supply depicted in FIG. 10.

Referring next to FIGS. 10 and 11, shown are examples of a bias supply 208 (comprising two power supplies) and a corresponding control system, respectively. More specifically, FIG. 10 is an example of the bias supply 208 that comprises the first power supply (Vsupply) 216 and the second power supply (Vrail supply) 218 so that the bias supply in FIG. 10 is a two-supply configuration, and FIG. 11 is a block diagram depicting examples of control aspects that may be utilized in connection with two-supply configurations such as the two-supply configuration depicted in FIG. 10. The switch network 220 may comprise a variety of different topologies including one or two switches, and as shown, the switch network 220 couples to the bias supply 208 at node 1050 (which is coupled to a positive output of the second power supply 218); at node 212 (which is coupled to a negative output of the second power supply 218); and at the output node 210.

As shown in FIG. 11, the control system may comprise two control "knobs" to control the DC voltages of Vsupply and Vrail. This approach is in contrast to prior approaches that control compensation current, $i_{comp}$, (to control a width of a distribution of ion energies) and control Vrail to achieve a desirable ion energy value, eV. In the approach depicted in FIG. 11, the voltages of the first power supply 216 (Vsupply) and the voltage of the second power supply (Vrail) may be controlled based on a general relationship:

$$\begin{bmatrix}\Delta Eion \\ Eion + \Delta Eion\end{bmatrix} = \begin{bmatrix}K_{11} & \varepsilon_{12} \\ 0 & K_{22}\end{bmatrix}\begin{bmatrix}V_{rail} \\ V_{supply}\end{bmatrix} + \begin{bmatrix}-1 \\ -1\end{bmatrix}$$

$$\frac{I_{ion}}{C_{ch}+C_{sh}}t_{ramp} \approx \begin{bmatrix}K_{11} & 0 \\ 0 & K_{22}\end{bmatrix}\begin{bmatrix}V_{rail} \\ V_{supply}\end{bmatrix} + \begin{bmatrix}-1 \\ -1\end{bmatrix}\frac{I_{ion}}{C_{ch}+C_{sh}}t_{ramp}$$

Where:

$$K_{11} = -\frac{C_{ch}}{C_{ch}+C_{sh}}\frac{2}{1+K}$$

$$K = \frac{1-K_c}{1+K_c\frac{V_{step}}{V_{ramp}}}, \text{ where } Vramp = vout(t3) - vout(t4);$$

$$K_c = \frac{C_{str} + \frac{C_{ch}C_{sh}}{C_{ch}+C_{sh}}}{C_{str}+C_{ch}}, \text{ where } Cstr = Cstr0 + Cstr1;$$

$$\varepsilon_{12} = \frac{C_{ch}}{C_{ch}+C_{sh}}\frac{2K}{1+K}\frac{T_{sw}}{t_{ramp}}; \text{ and}$$

$$K_{22} = \frac{C_{ch}}{C_{ch}+C_{sh}}\frac{2T_{sw}}{t_{ramp}},$$

where Tsw is the switching period (from $t_4-t_0$).

In this control approach, a first setpoint may be an ion energy setpoint, Eion_set and a second setpoint may be for a spread (also referred to as a distribution) of ion energies, ΔEion_set (both Eion_set and ΔEion_set are shown in FIG. 4), and the data processing module 630 may calculate Eion and ΔEion based upon the digital representations of $i_{out}$ and Vout received from the metrology component 620. As shown, the first comparator 638 may produce the first error signal, error1, based upon the difference between the first setpoint, Eion_set, and the calculated value of Eion, and the second comparator 640 may produce a second error signal, error2, based upon the difference between the second setpoint, ΔEion_set, and the calculated value of ΔEion.

Alternatively, the first setpoint (to set an ion energy value) may be a Vstep setpoint and the second setpoint (to set the spread of ion energies) may be a slope setpoint (to set the slope, of the fourth portion (between times t3 and t4) of the asymmetric periodic voltage waveform) or the second setpoint may be a slope-deviation-factor setpoint (to set the slope deviation factor, Ks). The data processing module 630 may calculate Vstep and the slope or the slope deviation factor, Ks based upon the digital representations of $i_{out}$ and Vout received from the metrology component 620. In this alternative, the first comparator 638 may produce the first error signal, error1, based upon the difference between the first setpoint (e.g., a Vstep setpoint) and the calculated value of Vstep, and the second comparator 640 may produce a second error signal, error2, based upon the difference between the second setpoint (either a slope setpoint or a slope-deviation-factor setpoint) and the calculated value of the slope or the calculate value of the slope deviation factor, Ks.

As shown, the control system may comprise two compensators: a first compensator 1132A and a second compensator 1132B associated with two control loops. And the first compensator 1132A may receive the first error signal, error1, and produce a signal, Vsupply_set, to control the first power supply 216. The second compensator 1132B may receive the second error signal, error2, and produce a signal, Vrail_set, to control the second power supply 218. In some variations, the gate drive signal generator 636 may be set with fixed switching times for the first switch (and second switch in a two-switch bias supply) of the bias supply 208. In other variations, the timing parameter estimator 634 may provide a pulse-width signal so that the gate drive signal generator 636 may close the switches of the bias supply 208 to provide zero-current switching. Each of the compensators 1132A, 1132B may be realized by a proportional-integral-derivative (PID) controller, and in some variations, a bandwidth of the first compensator 1132A is set to be different from the bandwidth of the second compensator 1132B, which enables the two control loops associated with each of the compensators 1132A, 1132B to be decoupled. For example, a sampling rate of each control loop may be set to a different rate to result in the different bandwidths. Another option, as generalized in FIG. 6, a single control loop associated with MIMO compensator 632 can be used with multiple inputs (shown generally as error1 and error2 in FIG. 6) and multiple outputs where Ctrl_knob1 and Ctrl_knob2 in FIG. 6 may be Vsupply_set and Vrail_set, respectively.

Figure 12:
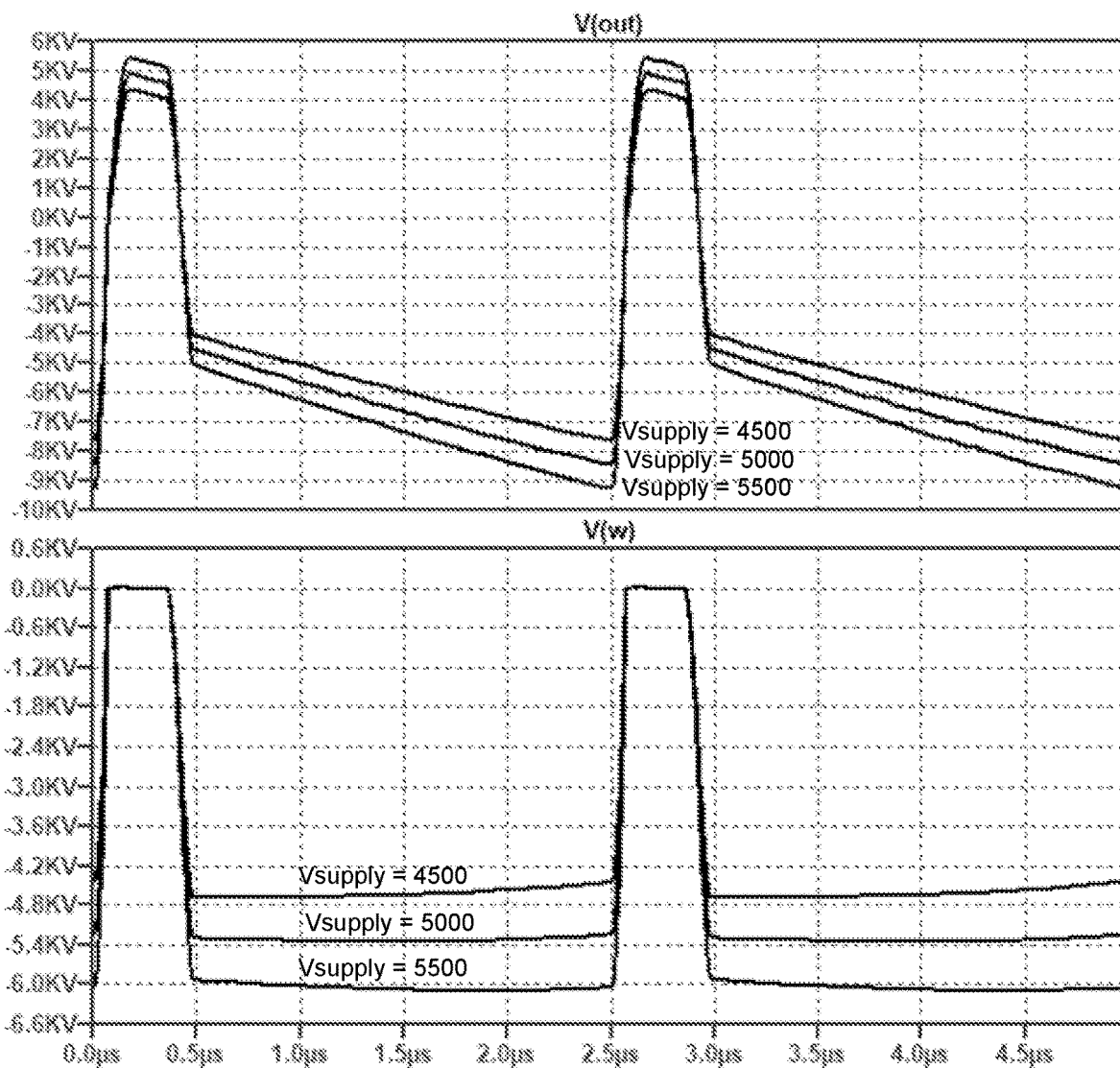
FIG. 12 includes graphs depicting examples of asymmetric periodic voltage waveforms and corresponding sheath and wafer voltages consistent with a mode of operating the bias supply of FIG. 10 using the control system of FIG. 11.
Figure 13:
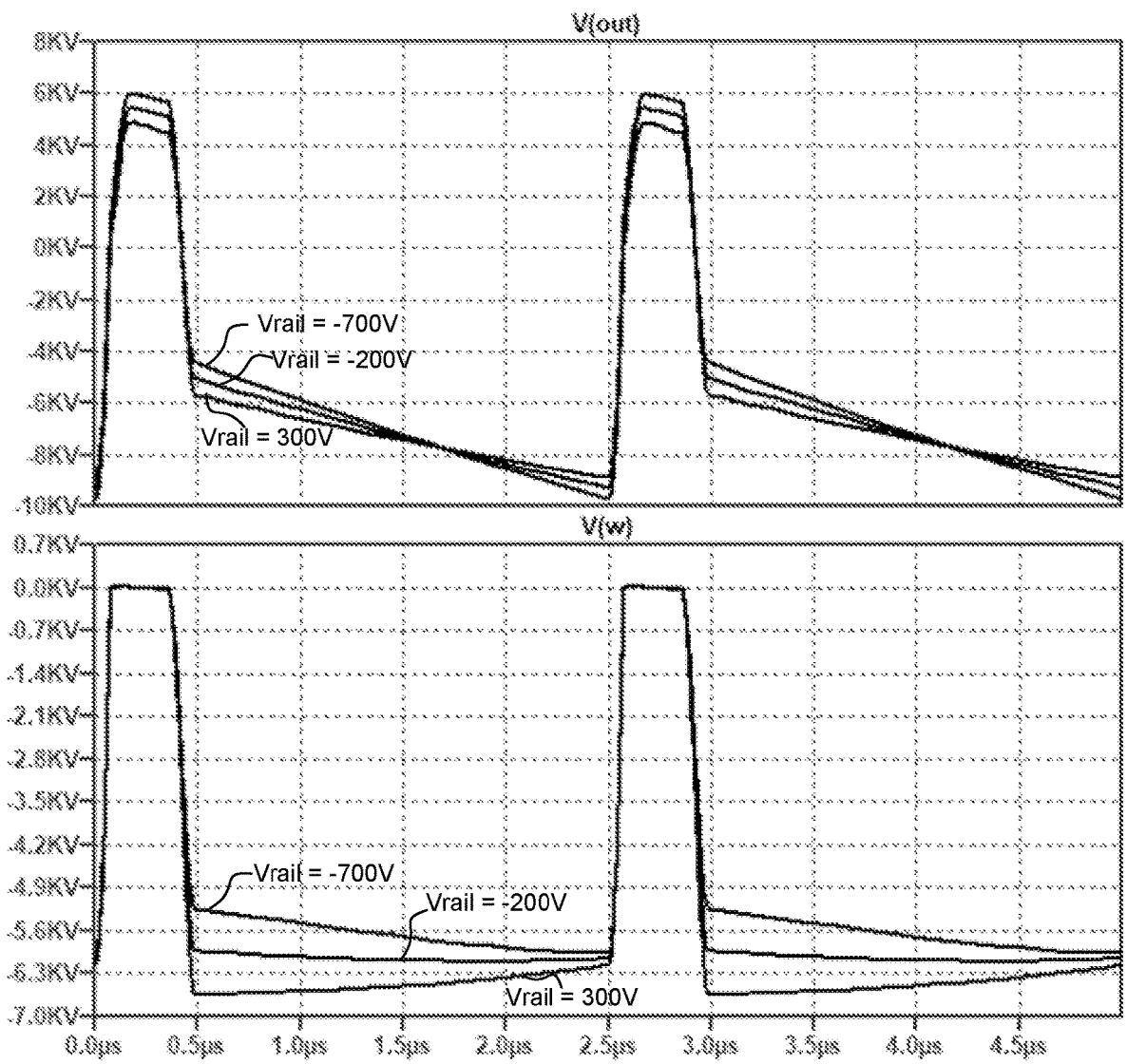
FIG. 13 includes graphs depicting examples of asymmetric periodic voltage waveforms and corresponding sheath and wafer voltages consistent with another mode of operating the bias supply of FIG. 10 using the control system of FIG. 11.

Referring to FIGS. 12 and 13, shown are examples of how the first power supply 216 and the second power supply 218 may be controlled. More specifically, in the graphs shown in FIG. 12, the voltage of the second power supply 218 (Vrail) is fixed at −2000V and three examples of the asymmetric periodic voltage waveforms are depicted when the first power supply 216 is set to 4500V, 5000V, and 5500V. Also shown are three wafer voltage V(w) waveforms that correspond to the three asymmetric periodic voltage waveforms.

In FIG. 13, shown are graphs of three examples where the voltage of the first power supply 216 is set to 5500V and the voltage of the second power supply 218 is set to 300V, −200V, and −700V. Also shown are three wafer voltage V(w) waveforms that correspond to the three asymmetric periodic voltage waveforms. FIGS. 12 and 13 are provided merely as examples of the ability to effectuate a desired ion energy value and ion energy distribution using the first power supply 216 and the second power supply 218, but it should be recognized that in many variations both the first power supply 216 and the second power supply 218 are variable power supplies that may be adjusted and controlled using the control system depicted in FIG. 11.

Figure 14A:
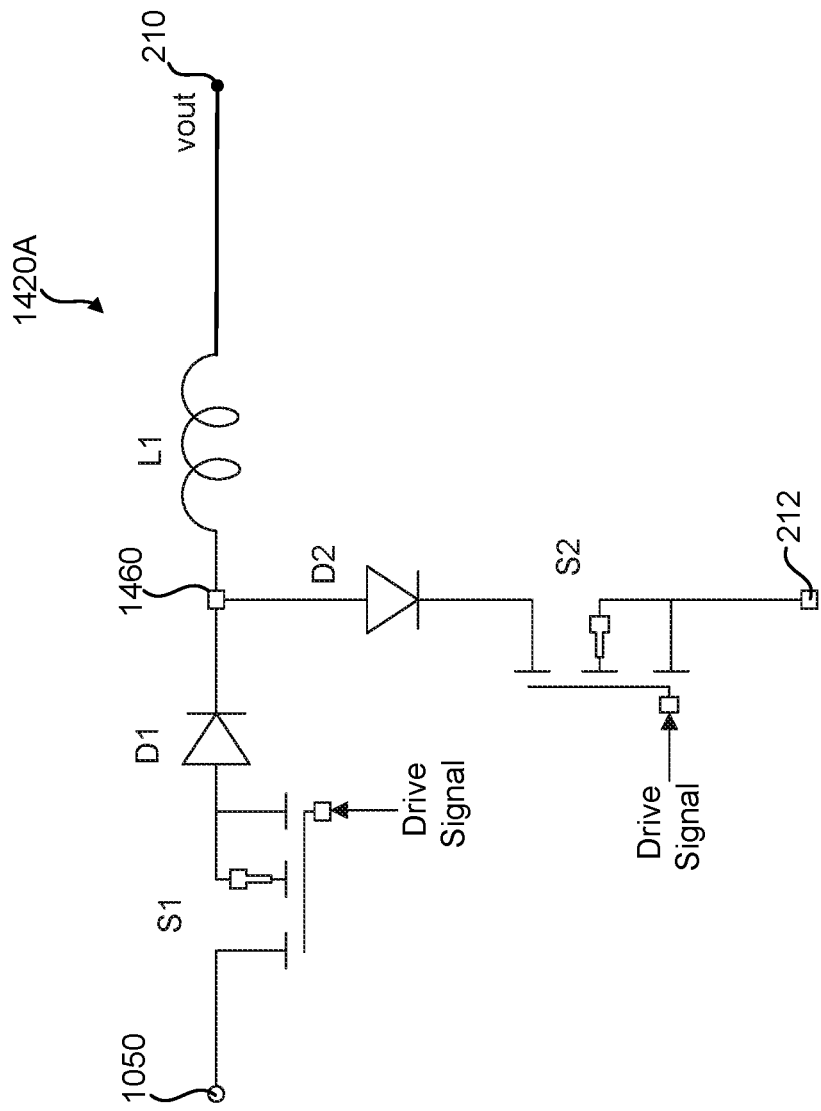
FIG. 14A is a schematic diagram depicting an example of the switch network depicted in FIG. 10 that comprises two active switches.
Figure 14B:
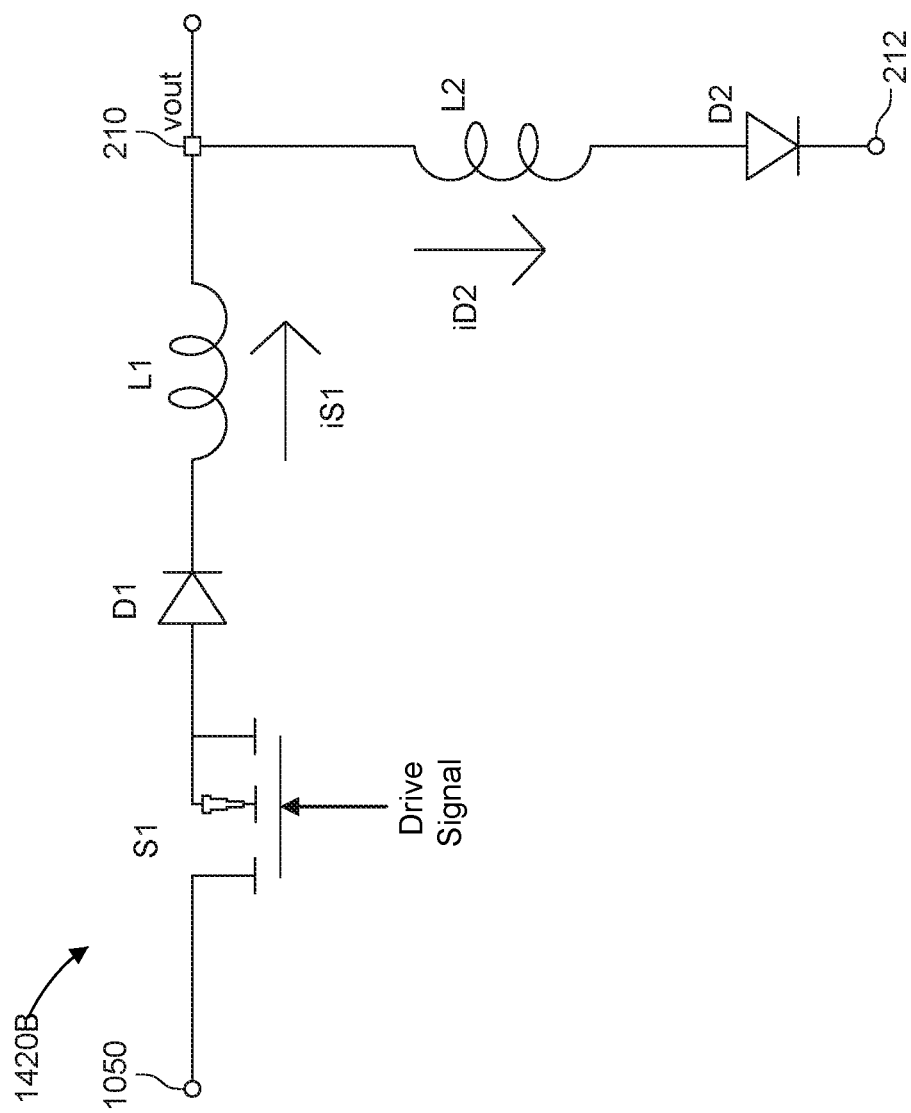
FIG. 14B is a schematic diagram depicting another example of the switch network depicted in FIG. 10 that comprises one active switch.

Referring next to FIGS. 14A and 14B, shown are examples of switch networks that may be used in connection with the two-supply configuration of FIG. 10. Referring first to FIG. 14A, the switch network 1420A is a two-switch network that couples to the bias supply 208 at node 1050, the return node 212, and the output node 210. Also shown for reference in the switch network is node 1460. As depicted, the switch network 1420A comprises a first switch, S1, arranged in series with a first diode D1 between node 1050 and node 1460. A cathode of the diode D1 is coupled to the node 1460 and an anode of the diode D1 is coupled to the switch S1. The switch network 1420A also comprises a second switch S2 (arranged in series with a second diode D2) between the return node 212 and node 1460. An anode of the diode D2 is coupled to the node 1460 and a cathode of the diode D2 is coupled to the switch S2. In addition, an inductor L1 is positioned between the node 1460 and the output node 210.

In operation, the switches (S1 and S2) are operated, as described with reference to FIG. 4, to create the asymmetric periodic waveform Vout and the output current $i_{out}$ depicted in FIG. 4. It should be recognized that (because the switch S1 and the diode D1 are arranged in series the order of the switch S1 and the diode D1 may be swapped. Similarly, because the switch S2 and the diode D2 are arranged in series, the order of the switch S2 and the diode D2 may be swapped.

In many implementations, the switches disclosed herein are realized by a field-effect switches such as metal-oxide semiconductor field-effect transistors (MOSFETS), and in some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by an insulated gate bipolar transistor (IGBT). In these implementations, the gate drive signal generator 636 may comprise an electrical driver known in the art that is configured to apply electrical drive signals to the switches responsive to signals from the timing parameter estimator 634 and/or the one or more compensators 632. It is also contemplated that the drive signals may be sent via optical lines to convey optical switching signals. And the switches may switch in response to the optical signal and/or optical signals that are converted to an electrical drive signal.

It should be recognized that each of the switches depicted herein generally represents one or more switches that are capable of closing and opening to connect and disconnect, respectively, a current pathway. For example, each of the switches may be realized by a plurality of switches arranged is series (for enhanced voltage capability), may be realized by a plurality of switches arranged is parallel (for enhanced current capability), or each of the switches may be comprised of a plurality of switches arranged in a series-parallel combination (for enhanced voltage and or current capability). In these variations, one of ordinary skill in the art will recognize that each switch may be synchronously driven by a corresponding drive signal.

It should also me be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Referring next to FIG. 14B shown is another example of the switch network 220 depicted in FIGS. 2 and 10. As shown, the switch network 14B comprises a first current pathway (for current iS1), between the node 1050 and the output node 210. The first current pathway comprises a series combination of a switch S1 a diode D1 and an inductor L1. In addition, the switch network 1420B comprises second current pathway (for current iD2), (between the output node 210 and the return node 212), which comprises a second diode D2 and an inductive element, L2.

In operation, the switch S1 in switch network 1420B may be operated as shown in FIG. 5 to create the asymmetric periodic waveform Vout and the output current $i_{out}$ depicted in FIG. 5. It should be recognized that (because the switch S1 the diode D1 and the inductor L1 are arranged in series), the order in which the switch S1 the diode D1 and the inductor L1 are positioned (between node 1050 and the output node 210 may be swapped.

Figure 15:
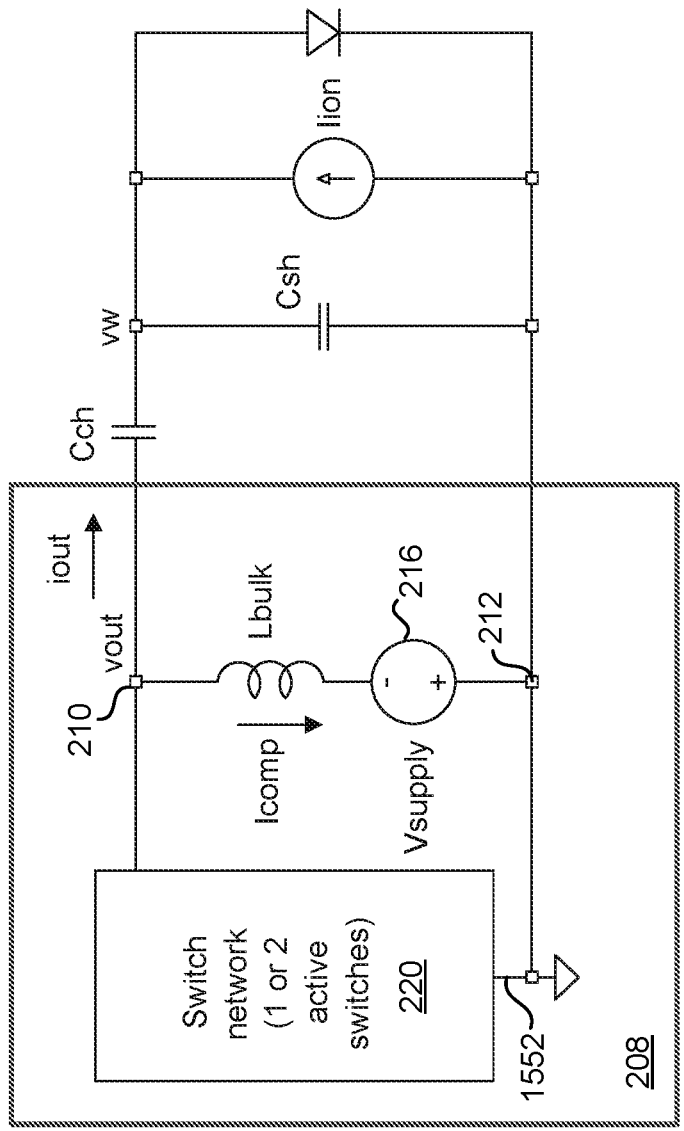
FIG. 15 is a schematic diagram depicting yet another example of a bias supply with a single power supply.
Figure 16:
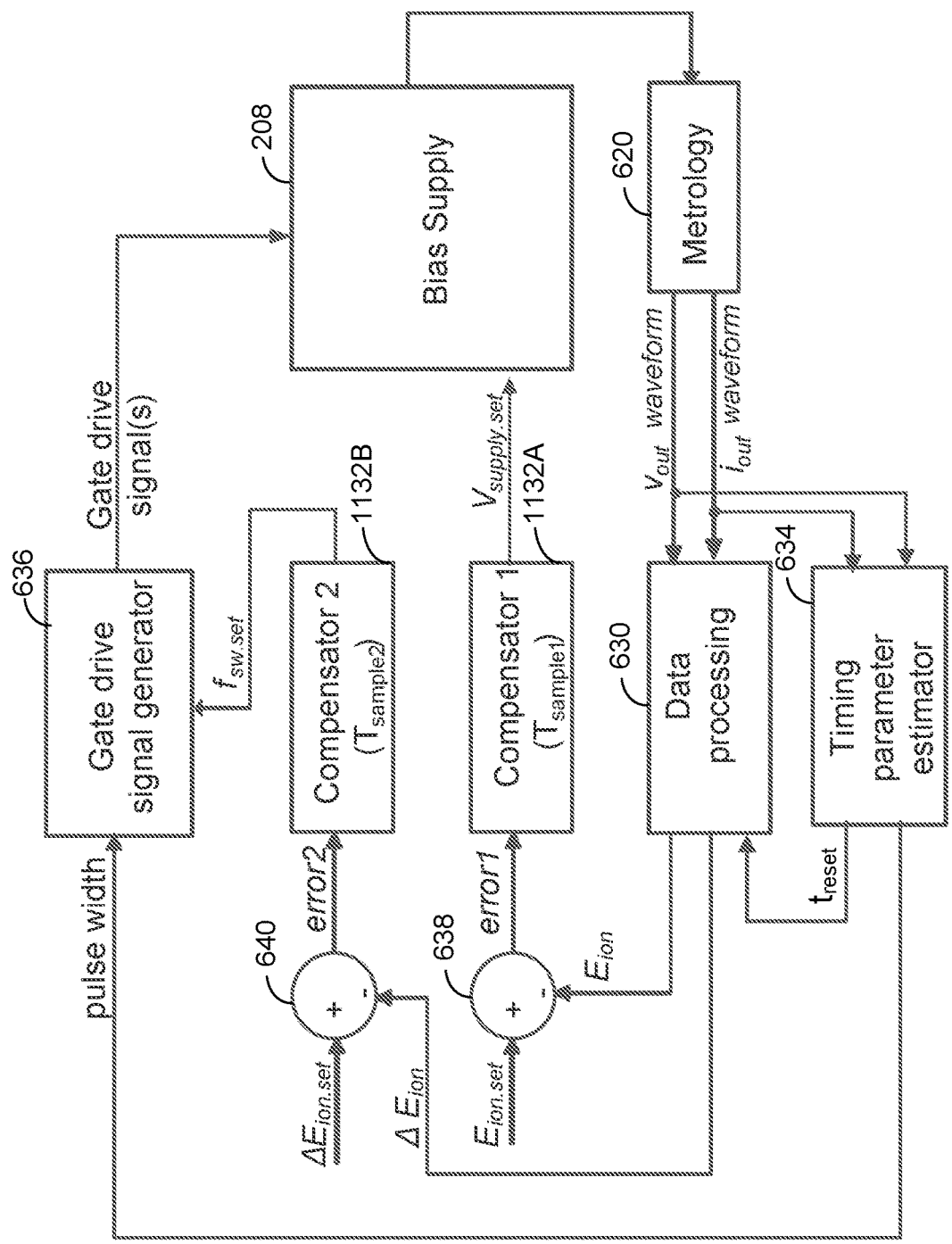
FIG. 16 is a block diagram depicting a control system for a bias supply with a single power supply such as the bias supply depicted in FIG. 15.
Figure 17:
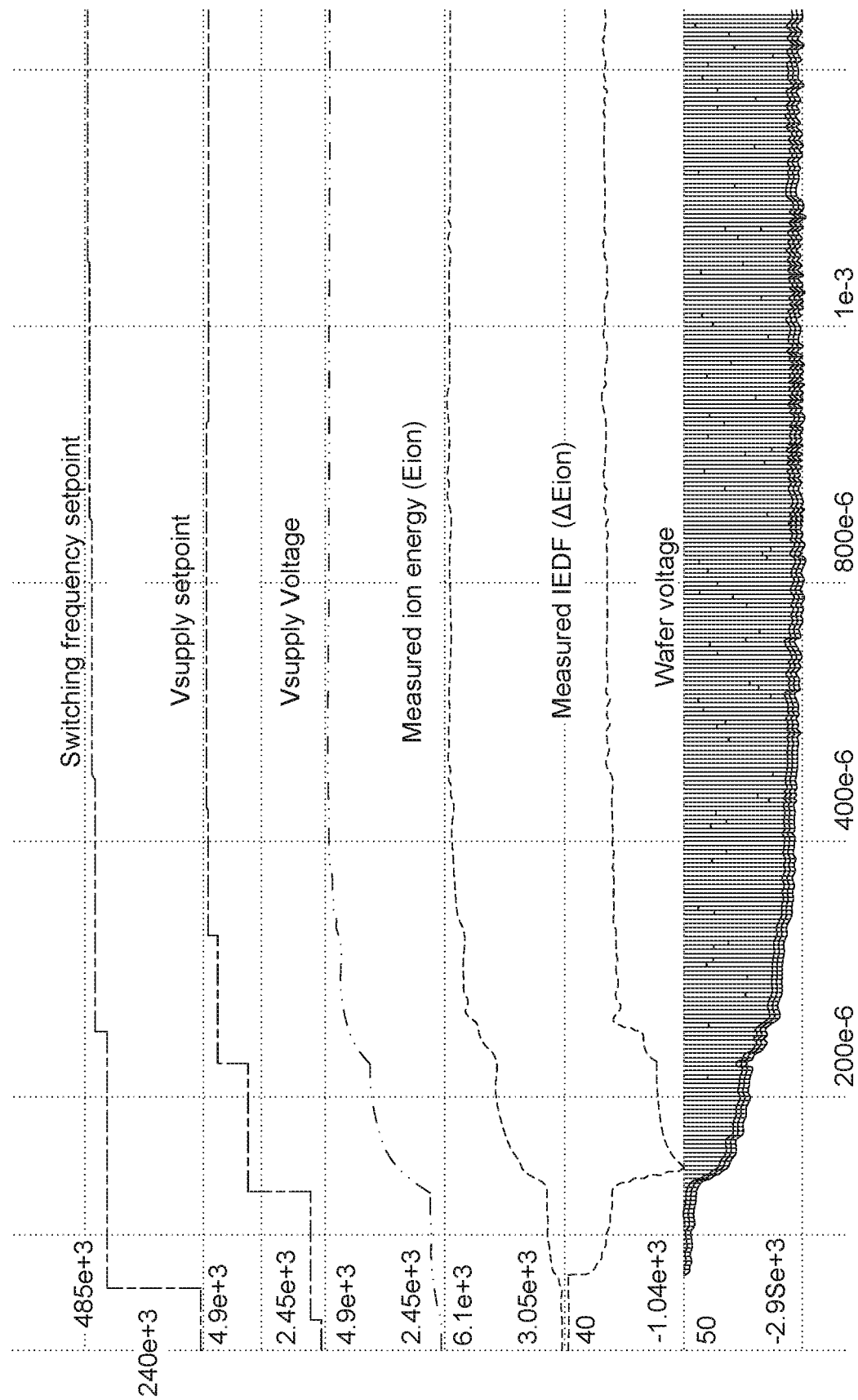
FIG. 17 includes graphs depicting an example of operational aspects of the bias supply depicted in FIG. 15 when controlled by the control system of FIG. 16.

Referring next to FIGS. 15 and 16, shown are a schematic diagram (depicting the bias supply 208 with the first power supply 216 as a single power supply) and a block diagram depicting a control system for the bias supply 208, respectively. As shown, the control system for a single supply configuration is similar to the control system for a two-supply configuration (described with reference to FIG. 11) except the second compensator 1132B provides a frequency setpoint signal $F_{sw\_set}$ to control a frequency of the switching of the bias supply 208. As shown in FIG. 17, switching frequency in connection with the voltage applied by the first power supply 216 may be used to effectuate a desired ion energy value, Eion, and a desired ion energy distribution, ΔEion.

Figure 18A:
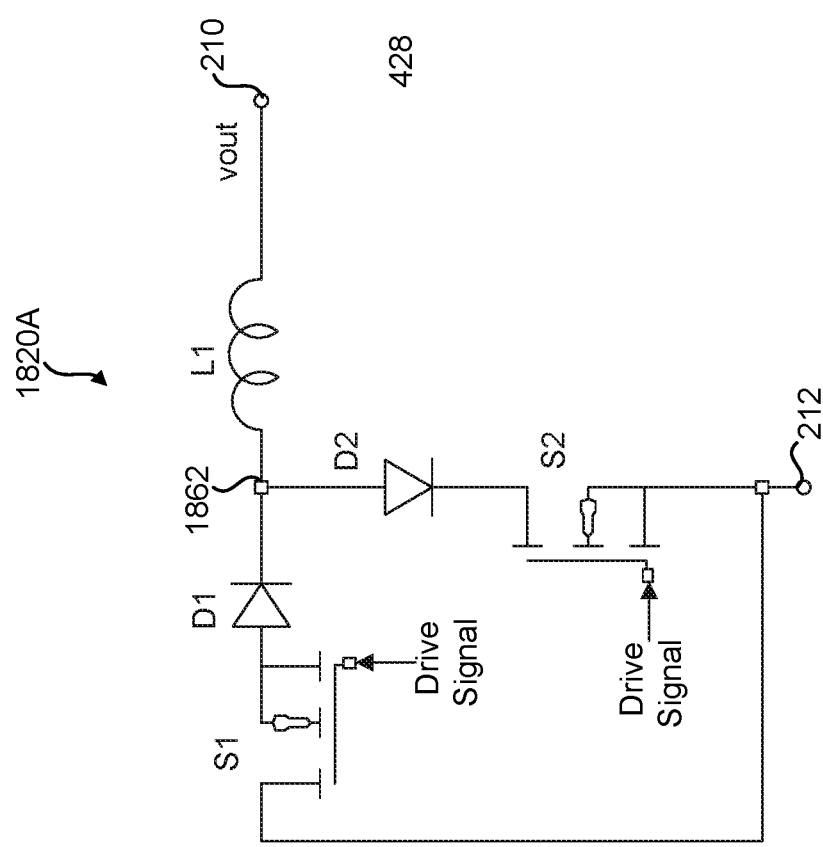
FIG. 18A is a schematic diagram depicting an example of the switch network depicted in FIG. 15 that comprises a single active switch.

Referring next to FIG. 18A, shown is a schematic depicting a switch network 1820A that is an example of the switch network 220 that comprises two switches: a first switch S1 and a second switch S2. In the variation depicted in FIG. 18A, a series combination of the first switch S1 and the first diode D1 is arranged between the return node 212 of the bias supply 208 and node 1862. In addition, a series combination of the second switch S2 and the second diode D2 is arranged between the node 1862 and the return node 212 of the bias supply 208. As shown in FIG. 18A, the first diode D1 is arranged between the first switch S1 and the node 1862 with its anode coupled to the first switch S1 and its cathode coupled to the node 1862. The second diode D2 is arranged between the second switch S2 and the node 1862 with its cathode coupled to the second switch S2 and its anode coupled to the node 1862. In this arrangement, the cathode of the first diode D1 is coupled to the anode of the second diode D2 at the node 1862.

In operation, first diode D1 conducts when the first switch S1 is closed, and a second diode D2 conducts when the second switch D2 is closed. And the first switch S1 and the second switch S2 are controlled as depicted in FIG. 4 to produce the asymmetric periodic voltage waveform Vout and the output current $i_{out}$ (shown in FIG. 4). Although not depicted, it should be recognized that the position of the first switch S1 and the position of the first diode D1 may be swapped. Similarly, the position of the second switch S2 and the position of the second diode D2 may be swapped.

Figure 18B:
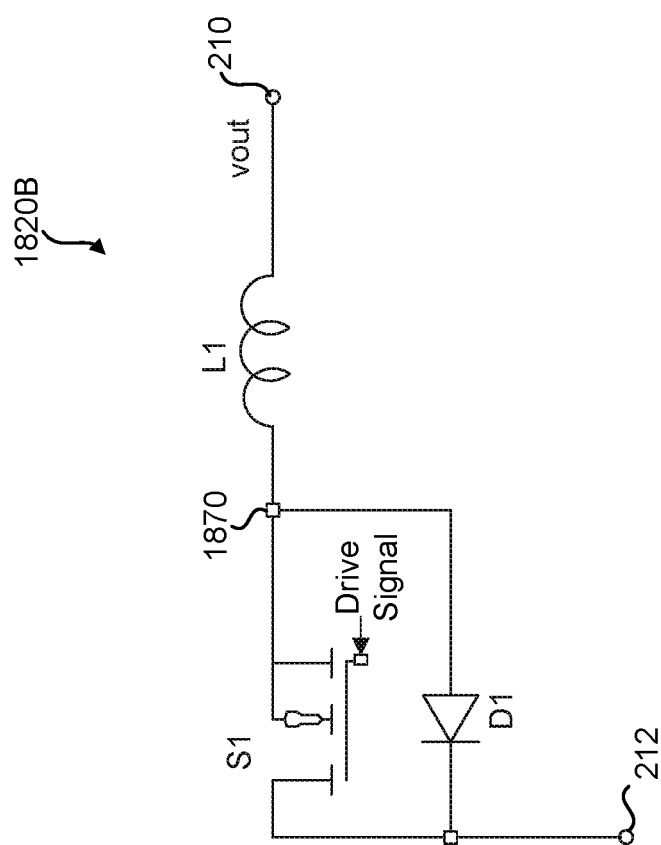
FIG. 18B is a schematic diagram depicting another example of the switch network depicted in FIG. 15 that comprises a single active switch.

Referring to FIG. 18B, shown is a schematic drawing depicting a switch network 1820B that is another example of the switch network 220 that comprises a single switch: S1. As shown, a first inductor L1 is coupled between a node 1870 and the output node 210. And the switch S1 is coupled between the node 1870 and the return node 212. A diode D1 is coupled in parallel with the switch S1 between the node 1870 and the return node 212. In operation, the switch S1 is opened and closed, as shown in FIG. 5, to produce the asymmetric periodic voltage function Vout and the output current $i_{out}$ shown in FIG. 5. For example, an application of the asymmetric periodic voltage waveform is effectuated between the output node 210 and the return node 212 by closing the switch S1 to cause the output current $i_{out}$ to change from $-I_o$ to a peak value and back to $-I_o$. After the switch S1 is opened the current increases to a peak value in an opposite direction and back to $-I_o$. To reduce losses, the timing parameter estimator 634 may optionally detect when the output current $i_{out}$ is reaching $I_o$ and provide the gate drive signal generator 636 a signal to cause the switch S1 to open when the output current $i_{out}$ is at $I_o$.

Figure 18C:
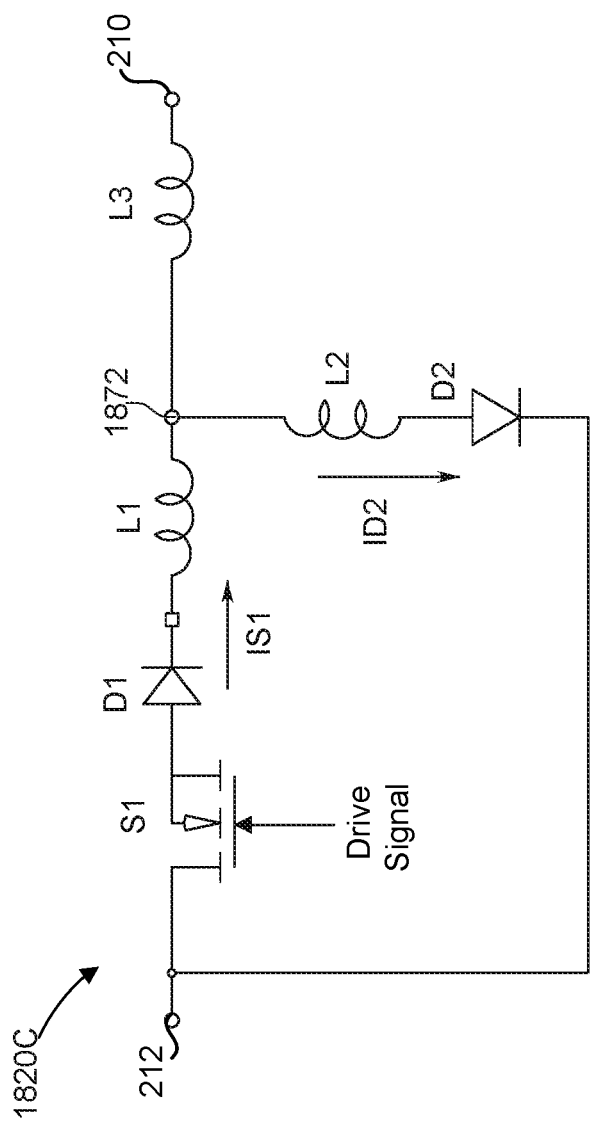
FIG. 18C is a schematic diagram depicting yet another example of the switch network depicted in FIG. 15 that comprises a single active switch.

Referring to FIG. 18C, shown is a schematic drawing depicting a switch network 1820C that is another example of the switch network 220 that comprises a single switch: S1. As shown, the switch network 1820C comprises a first current pathway (for current iS1), between the return node 212 and node 1872. The first current pathway comprises a series combination of the switch S1 a diode D1 and an inductor L1. In addition, the switch network 1820C comprises second current pathway (for current iD2), (between the node 1872 and the return node 212), which comprises a second diode D2 and an inductive element L2. As shown, a cathode of diode D2 is coupled to the return node 212, and a third inductor L3 is positioned between the node 1872 and the output node 210.

Figure 19:
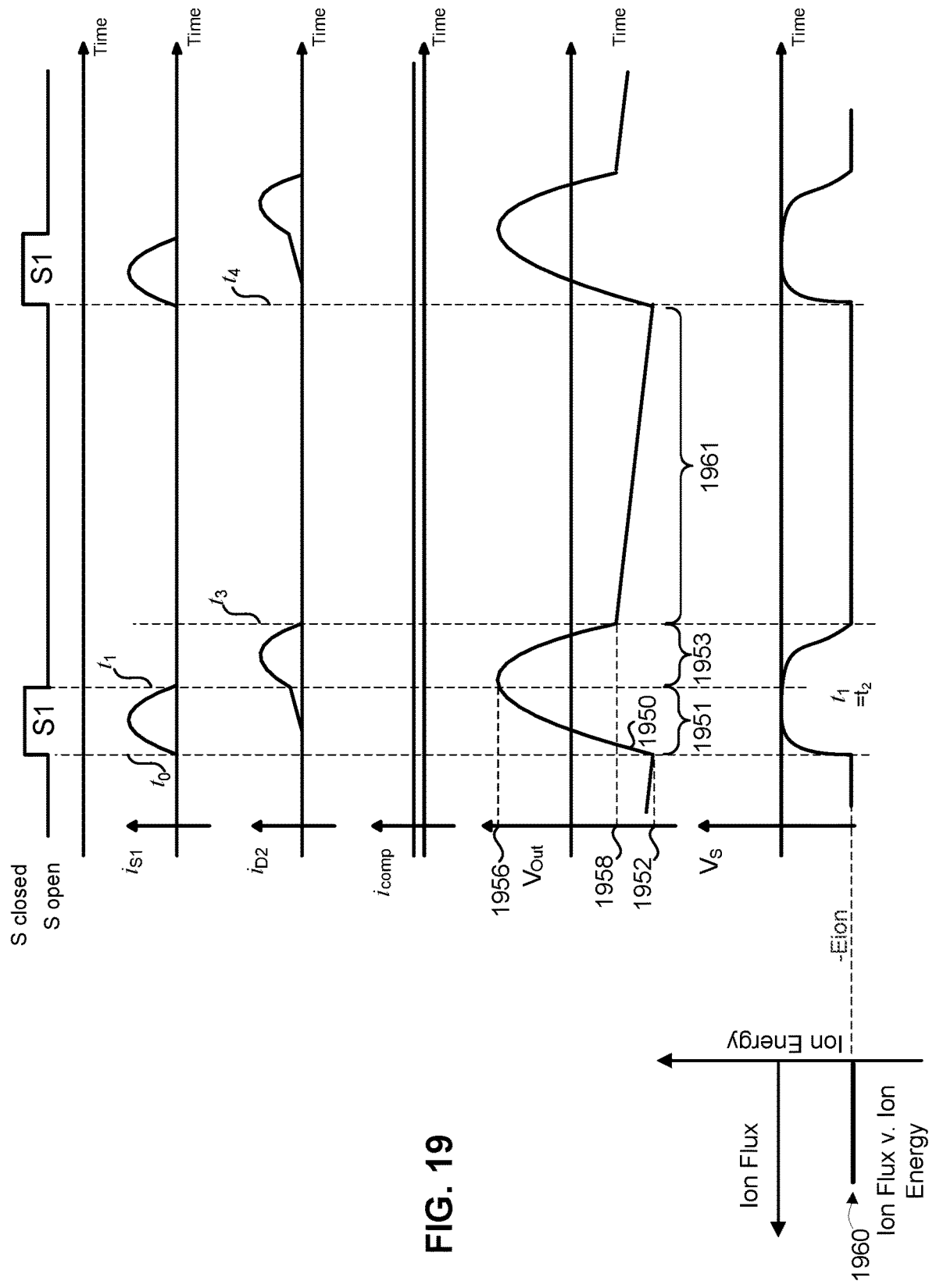
FIG. 19 depicts graphs and a timing diagram depicting aspects of a bias supply that comprises switch network depicted in FIG. 18C.

In operation, the switch S1 in switch network 1820C may be operated as shown in FIG. 19 to create a full cycle of the asymmetric periodic voltage waveform, Vout, between the output node 210 and the return node 212 from the time t0 to the time t4. Also depicted in FIG. 19 is a sheath voltage, Vs, that corresponds to the asymmetrical periodic voltage. As shown, the asymmetric periodic voltage waveform, Vout, achieves a sheath voltage, Vs, that is generally negative to attract ions to impact a surface of the workpiece to enable etching of the workpiece 103.

When the switch S1 is closed at a time t0, the current pathway (comprising the switch S1, diode D1, and inductor L1) connects the return node 212 to the node 1872 and unidirectional current, iS1, begins to increase from zero current at the time, t0, and the asymmetrical periodic voltage Vout (relative to the return node 212) applied at the output node 210 begins to move (over a first portion 1951 of the of the periodic voltage waveform) from a first negative voltage 1952 to a positive peak voltage 1956. As shown, the current, iS1, increases to a peak value and then decreases to zero at a time, t1, when the switch, S1, is opened. As shown, iD2, increases in a ramp-like manner while the switch S1 is closed so that the current iD2 is non-zero when the switch S1 is opened at the time, t1.

As depicted, when the current, iS1, through the first current pathway drops to zero and the switch S1 is opened, the asymmetric periodic voltage drops from the positive peak voltage 1956. And after the switch S1 is opened (during a second portion 1953 of the asymmetrical waveform), unidirectional current, iD2, increases through the second current pathway (through the second diode D2), peaks, and then drops to zero current flow from time t1 to a time t3. As shown, the increase and fall of the unidirectional current, iD2, occurs while the asymmetrical periodic voltage changes (during the second portion 1953) from the positive peak voltage 1956 to a third. negative, voltage level 1958. As depicted, during the time from t0 to t3, the first portion 1951 of the asymmetric periodic voltage causes the sheath voltage, Vs, to approach a positive voltage to repel positive charges (that accumulate on the surface of the workpiece while the surface of the workpiece is held at a negative voltage), and the second portion 1953 of the asymmetric periodic voltage causes the sheath voltage, Vs, to become a desired negative voltage (or range of voltages) to achieve an ion flux that achieves a desired ion energy value 1960.

As depicted, after the unidirectional current, iD2, rises and falls back to a level of zero current, the asymmetrical periodic voltage, Vout, becomes more negative (as a negative voltage ramp) during a fourth portion 1961 until the switch S1 is closed again at a time t4. As depicted, compensation current, icomp, may be provided during a cycle of the asymmetric periodic voltage to compensate for ion current in the plasma chamber 101. For example, without the compensation current, icomp, the sheath voltage, Vs, may gradually change to become more positive during the fourth portion of the asymmetric periodic voltage, which creates a broader distribution of ion energies, which may be undesirable. But in some variations, the compensation current, icomp, may intentionally be set to overcompensate or undercompensate for ion current in the plasma chamber 101 to create a broader distribution of ion energies. In the mode of operation depicted in FIGS. 19, the compensation current, icomp, provides a sheath voltage, Vs, that is substantially constant during the fourth portion 661 of the asymmetrical periodic voltage, Vo.

It should be recognized that (because the switch S1 the diode D1 and the inductor L1 are arranged in series), the order in which the switch S1 the diode D1, and the inductor L1 are positioned (between the return node 212 and the node 1872 may be changed. In addition, the order in which L2 and D2 are arranged may be swapped.

To maintain a narrow ion energy distribution (IED) width, the switching frequency is increased at higher ion current and lower ion energy. Note that changing switching frequency also affects the ion energy (eV) level and requires adjustment of the first power supply 216 to keep a constant ion energy. A multiple input multiple output (MIMO) control system shown in FIG. 6 can still be implemented for this system configuration, where the control variables are $$\begin{bmatrix} \Delta Eion \\ Eion \end{bmatrix} \text{ or } \begin{bmatrix} \text{Slope} \\ Vstep \end{bmatrix} \text{ or } \begin{bmatrix} Ks \\ Vstep \end{bmatrix}$$

and two control knobs are $$\begin{bmatrix} fsw\_set \\ Vsupply\_set \end{bmatrix}.$$

Alternatively, as shown in FIG. 16, two separate single input single output (SISO) control loops are feasible, where fsw only controls ΔEion and the first power supply controls Eion. The two control loops may be decoupled by having different bandwidths. This can be realized by tuning PID compensator coefficients properly or setting the sampling rates of the two control loops differently. The latter option reduces computation effort in a digital control system.

Referring back to FIGS. 6, 11, and 16, shown are block diagrams depicting aspects of sampling, readback, and control methods for the bias supply 208. An aspect of these methods comprises applying an asymmetric periodic voltage waveform Vout (at the output node 210 relative to the return node 212) and providing a corresponding output current waveform $I_{out}$. Voltage and current signals indicative of the periodic voltage waveform and the corresponding current waveform are received and sampled (e.g., by the metrology component 620) to provide digital representations of the asymmetric periodic voltage waveform and the corresponding current waveform. The digital representations of the asymmetric periodic voltage waveform and the corresponding current waveform are processed (e.g., by the data processing module 630) to produce a first readback value indicative of ion energy and a second readback value indicative of an ion energy distribution. Depending upon the implementation, as described above, the data processing module 630 may provide parameter values utilized in one or more control loops to control desired attributes of, for example and without limitation, the asymmetric periodic voltage waveform, output current, ion energy, and ion energy distribution.

Figure 20:
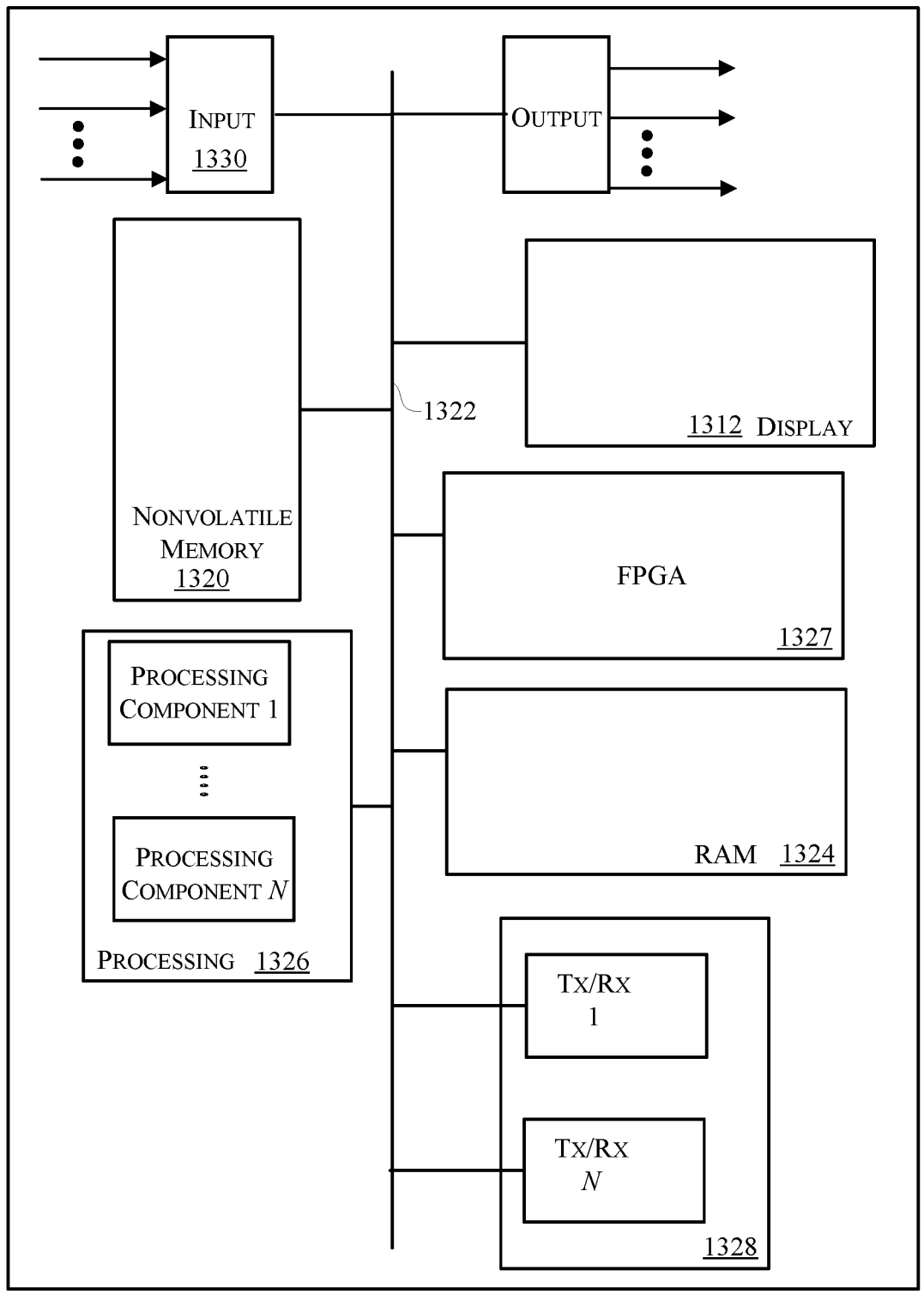
FIG. 20 is a block diagram depicting components that may be utilized to implement control aspects disclosed herein.

This method and other variations of this method described herein may be embodied directly in hardware, in processor-executable code encoded in a non-transitory tangible processor readable storage medium, or in a combination of the two. Referring to FIG. 20 for example, shown is a block diagram depicting physical components that may be utilized to realize control aspects disclosed herein. As shown, in this embodiment a display 1312 and nonvolatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 20 represent physical components, FIG. 20 is not intended to be a detailed hardware diagram; thus, many of the components depicted in FIG. 20 may be realized by common constructs or distributed among additional physical components. Moreover, it is contemplated that other existing and yet-to-be developed physical components and architectures may be utilized to implement the functional components described with reference to FIG. 20.

This display 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of a method of biasing a substrate with the bias supply 208 described herein.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1320 and executed by the N processing components in connection with RAM 1324. As one of ordinarily skill in the art will appreciate, the processing portion 1326 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in non-volatile memory 1320 and accessed (e.g., during boot up) to configure a field programmable gate array (FPGA) to implement the algorithms disclosed herein.

The input component 1330 may receive power related signals (e.g., signals indicative of output current, Iout, and voltage, Vout) obtained (e.g., by current transducers, VI sensors, current transducers, and/or voltage sensors) at the output node 210 and/or return node 212 of the disclosed bias supplies 208. Although not required, in some implementations the FPGA 1327 may sample the power-related signals and provide the digital representations of output current, Iout, and output voltage Vout. In some embodiments, the processing components 1326 (in connection with processor-executable instructions stored in the nonvolatile memory 1320) are used to realize the data processing module, comparators, and compensators disclosed herein. In addition, the input component 1330 may receive phase information and/or a synchronization signal between bias supplies 108 and source generator 112 that are indicative of one or more aspects of an environment within a plasma processing chamber 101 and/or synchronized control between a source generator and the single switch bias supply. The signals received at the input component may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

The output component generally operates to provide one or more analog or digital signals to effectuate the gate drive signals for opening and closing of the switches. The output component may also control of the power supplies described herein.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A bias supply comprising:
an output node;
a switch network and at least one power supply coupled to the output node the switch network and the at least one power supply configured, in combination, to apply an asymmetric periodic voltage waveform and provide a corresponding current waveform at the output node, wherein each cycle of the asymmetric periodic voltage waveform includes a first portion that begins with a first negative voltage and changes to a positive peak voltage during the first portion, the asymmetric periodic voltage waveform also changes from the first portion to a third voltage level during a second portion, and the asymmetric periodic voltage waveform comprises a third portion that includes a voltage ramp from between the third voltage level and a fourth voltage level;
a metrology component configured to receive and sample voltage signals indicative of at least a portion of the asymmetric periodic voltage waveform to provide a digital representation of the at least a portion asymmetric periodic voltage waveform; and
a data processing module configured to adjust the digital representation based upon an inductance coupled to the output node.

2. The bias supply of claim 1, wherein the data processing module is configured to adjust the digital representation based upon inductive elements coupled between the output node and an input to a plasma chamber to construct a representation of the asymmetric periodic voltage waveform at the input to the plasma chamber.

3. The bias supply of claim 1, wherein the data processing module is configured to calculate a wafer voltage of a wafer coupled to the output node via the inductance and a chuck.

4. The bias supply of claim 1, wherein the data processing module is configured to obtain an ion energy value using an adjusted digital representation of the asymmetric periodic voltage waveform that is adjusted to compensate for an inductance between the output node and a chuck coupled to the output node.

5. The bias supply of claim 1, wherein the data processing module is configured to obtain a calculation of Vstep at a chamber input by compensating for inductance between the output node and a chuck coupled to the output node.

6. The bias supply of claim 1, wherein the first portion transitions to the second portion or the first portion ends and the second portion starts at the positive peak voltage.

7. A method for applying a periodic voltage comprising:
applying an asymmetric periodic voltage waveform at an output node, wherein each cycle of the asymmetric periodic voltage waveform includes a first portion that begins with a first negative voltage and changes to a positive peak voltage during the first portion, the asymmetric periodic voltage waveform also changes from the positive peak voltage to a third voltage level during a second portion, and the asymmetric periodic voltage waveform comprises a third portion that includes a voltage ramp from between the third voltage level and a fourth voltage level;
receiving and sampling voltage signals indicative of the periodic voltage waveform to produce a digital representation of the at least a portion asymmetric periodic voltage waveform; and adjusting the digital representation based upon an inductance coupled to the output node.

8. The method of claim 7, wherein the first portion transitions to the second portion or the first portion ends and the second portion starts at the positive peak voltage.

9. The method of claim 7, comprising obtaining an ion energy value using the adjusted digital representation of the asymmetric periodic voltage waveform that is adjusted to compensate for inductance between the output node and a chuck coupled to the output node.

10. The method of claim 7, comprising calculating Vstep at a chamber input by compensating for the inductance between the output node and a chuck coupled to the output node.

11. The method of claim 7 comprising: obtaining a wafer voltage value using the adjusted digital representation of the asymmetric periodic voltage waveform that is adjusted to compensate for stray inductance.

12. A bias supply to apply a periodic voltage comprising:
an output node;
a switch network and at least one power supply to apply an asymmetric periodic voltage waveform relative to the output node, wherein each cycle of the asymmetric periodic voltage waveform includes a first portion that begins with a first negative voltage and changes to a positive peak voltage during the first portion, the asymmetric periodic voltage waveform also changes from the positive peak voltage to a third voltage level during a second portion, and the asymmetric periodic voltage waveform comprises a third portion that includes a voltage ramp from between the third voltage level and a fourth voltage level;
a metrology component configured to receive and sample voltage signals indicative of the asymmetric periodic voltage waveform to provide a digital representation of the asymmetric periodic voltage waveform; and
a processor and/or a field programmable gate array coupled to nonvolatile memory, the nonvolatile memory comprising non-transitory, processor executable instructions, the instructions comprising instructions to:
receive the digital representation of the asymmetric periodic voltage waveform; and
adjust the digital representation based upon an inductance coupled to the output node.

13. The bias supply of claim 12, wherein the first portion transitions to the second portion or the first portion ends and the second portion starts at the positive peak voltage.

14. The bias supply of claim 12, wherein the instructions include instructions to provide first readback value comprising one of ion energy or a voltage step, Vstep, between the positive peak voltage and the third voltage level.

15. The bias supply of claim 14, wherein the instructions include instructions to provide a second readback value comprising one of a deviation factor indicative of an ion energy distribution or a slope of the voltage ramp.

16. The bias supply of claim 12, wherein the instructions comprise instructions to obtain an ion energy value using an adjusted digital representation of the asymmetric periodic voltage waveform that is adjusted to compensate for inductance between the output node and a chuck coupled to the output node.

17. The bias supply of claim 12, wherein the instructions comprise instructions to obtain a calculation of Vstep at a chamber input by compensating for inductance between the output node and a chuck coupled to the output node.

18. The bias supply of claim 12, wherein the instructions comprise instructions to obtain a wafer voltage value using an adjusted digital representation of the asymmetric periodic voltage waveform that is adjusted to compensate for stray inductance.

* * * * *